(12) United States Patent
Blemel et al.

(10) Patent No.: US 12,327,705 B2
(45) Date of Patent: Jun. 10, 2025

(54) METHOD, SYSTEM, AND APPARATUS TO PREVENT ELECTRICAL OR THERMAL-BASED HAZARDS IN CONDUITS

(71) Applicants: Kenneth G Blemel, Albuquerque, NM (US); Kenneth D Blemel, Albuquerque, NM (US); Benjamin Allen Bone, Bard, NM (US); Jesse Min-Tze Adamczyk, Altadena, CA (US); Lara Rose Draelos, Albuquerque, NM (US); Mariana Flores-Olivas, Roswell, NM (US)

(72) Inventors: Kenneth G Blemel, Albuquerque, NM (US); Kenneth D Blemel, Albuquerque, NM (US); Benjamin Allen Bone, Bard, NM (US); Jesse Min-Tze Adamczyk, Altadena, CA (US); Lara Rose Draelos, Albuquerque, NM (US); Mariana Flores-Olivas, Roswell, NM (US)

( * ) Notice: Subject to any disclaimer, the term of this patent is extended or adjusted under 35 U.S.C. 154(b) by 0 days.

(21) Appl. No.: 18/480,374

(22) Filed: Oct. 3, 2023

(65) Prior Publication Data
US 2024/0029987 A1 Jan. 25, 2024

Related U.S. Application Data

(60) Continuation of application No. 17/401,680, filed on Aug. 13, 2021, now abandoned, which is a
(Continued)

(51) Int. Cl.
*H01H 71/10* (2006.01)
*G02F 1/1333* (2006.01)
(Continued)

(52) U.S. Cl.
CPC ....... *H01H 71/10* (2013.01); *G02F 1/133345* (2013.01); *G02F 1/136286* (2013.01);
(Continued)

(58) Field of Classification Search
CPC .............. G09G 3/3677; G09G 3/3266; G09G 2300/0426; G09G 3/3688; G09G 2300/0417; G09G 2320/043; G09G 2330/023; G09G 2330/021; H01L 27/1214; H01L 27/124; H01L 27/12; H01L 29/78678; H01L 27/1222; H01L 27/1255; H01L 29/78663; H01L 27/105; H01L 27/1251; H01L 27/3262; H01L 29/42384; H01L 27/3276; H01L 29/78696;
(Continued)

(56) References Cited

U.S. PATENT DOCUMENTS

| | | | | | |
|---|---|---|---|---|---|
| 2,022,907 | A | * | 12/1935 | Worley | H01H 37/38 |
| | | | | | 337/320 |
| 3,597,977 | A | * | 8/1971 | Zierak | G01K 5/326 |
| | | | | | 337/307 |

(Continued)

*Primary Examiner* — Anatoly Vortman

(57) ABSTRACT

A method, apparatus, and system for protection from hazards of conductivity is disclosed using non-electrical means to disrupt electrical current with a thermovolumetric substance. The purpose of this invention is to prevent hazardous conditions from occurring by disrupting the flow of electrical current prior to the development of arc fault conditions.

1 Claim, 5 Drawing Sheets

Related U.S. Application Data continuation of application No. 16/377,982, filed on Apr. 8, 2019, now abandoned, which is a continuation of application No. 15/873,311, filed on Jan. 17, 2018, now abandoned, which is a division of application No. 15/472,103, filed on Mar. 28, 2017, now abandoned.

(51) Int. Cl.

| | |
|---|---|
| *G02F 1/1362* | (2006.01) |
| *G02F 1/1368* | (2006.01) |
| *G09G 3/3266* | (2016.01) |
| *G09G 3/36* | (2006.01) |
| *G11C 19/28* | (2006.01) |
| *H01H 37/74* | (2006.01) |
| *H01H 71/02* | (2006.01) |
| *H01H 71/14* | (2006.01) |
| *H01L 27/105* | (2023.01) |
| *H01L 27/12* | (2006.01) |
| *H01L 29/786* | (2006.01) |
| *H10D 30/67* | (2025.01) |
| *H10D 86/00* | (2025.01) |
| *H10D 86/40* | (2025.01) |
| *H10D 86/60* | (2025.01) |
| *G02F 1/1343* | (2006.01) |
| *G02F 1/1345* | (2006.01) |
| *H10D 86/80* | (2025.01) |
| *H10K 59/121* | (2023.01) |
| *H10K 59/131* | (2023.01) |

(52) U.S. Cl.
CPC ......... *G02F 1/1368* (2013.01); *G09G 3/3266* (2013.01); *G09G 3/3677* (2013.01); *G11C 19/28* (2013.01); *H01H 37/74* (2013.01); *H01H 71/02* (2013.01); *H01H 71/14* (2013.01); *H10D 30/6732* (2025.01); *H10D 30/6745* (2025.01); *H10D 30/6746* (2025.01); *H10D 86/00* (2025.01); *H10D 86/40* (2025.01); *H10D 86/421* (2025.01); *H10D 86/441* (2025.01); *H10D 86/471* (2025.01); *H10D 86/481* (2025.01); *H10D 86/60* (2025.01); *G02F 1/134309* (2013.01); *G02F 1/13454* (2013.01); *G02F 1/13624* (2013.01); *G02F 2202/103* (2013.01); *G09G 3/3688* (2013.01); *G09G 2300/0417* (2013.01); *G09G 2300/0426* (2013.01); *G09G 2320/043* (2013.01); *G09G 2330/021* (2013.01); *G09G 2330/023* (2013.01); *H01H 2071/147* (2013.01); *H10D 30/673* (2025.01); *H10D 30/6757* (2025.01); *H10D 86/80* (2025.01); *H10K 59/1213* (2023.02); *H10K 59/131* (2023.02)

(58) Field of Classification Search
CPC ... H01L 27/13; G11C 19/28; G02F 1/136286; G02F 1/1368; G02F 1/133345; G02F 1/13454; G02F 1/134309; G02F 2202/103; G02F 1/13624; H01H 71/10; H01H 71/02
USPC .......................................................... 337/414
See application file for complete search history.

(56) References Cited

U.S. PATENT DOCUMENTS

| | | | | |
|---|---|---|---|---|
| 3,743,993 | A * | 7/1973 | Alley ..................... | H01H 81/02 374/E5.001 |
| 4,025,889 | A * | 5/1977 | Schwarz ............... | H01H 37/764 337/408 |
| 4,306,210 | A * | 12/1981 | Saur ........................ | H01H 37/32 337/2 |
| 4,389,629 | A * | 6/1983 | Saur ........................ | H01H 37/64 337/315 |
| 5,859,579 | A * | 1/1999 | Branston ................ | H01H 71/14 337/116 |
| 5,897,055 | A * | 4/1999 | Saur ........................ | H01H 37/36 337/123 |
| 6,255,934 | B1 * | 7/2001 | Gadini .................... | D06F 37/42 337/123 |
| 6,396,382 | B1 * | 5/2002 | Ross ....................... | H01H 1/0036 60/527 |
| 6,583,711 | B2 * | 6/2003 | Yang ........................ | H01H 9/10 337/123 |
| 7,755,899 | B2 * | 7/2010 | Stenmark ................ | H01H 37/36 337/393 |
| 9,093,203 | B2 * | 7/2015 | Depping ................. | H01H 37/36 |
| 9,464,946 | B2 * | 10/2016 | Blemel ................... | H01H 71/145 |
| 2016/0099126 | A1 * | 4/2016 | Blemel ................... | H02S 40/34 337/382 |

* cited by examiner

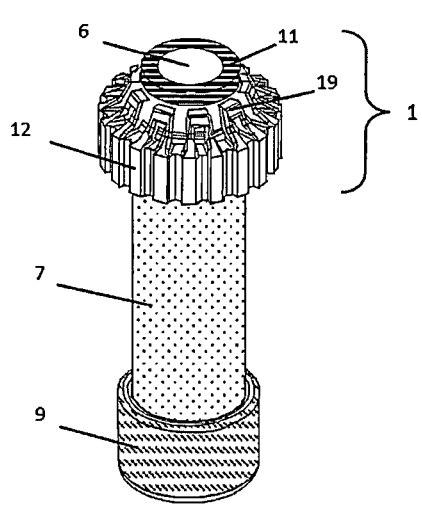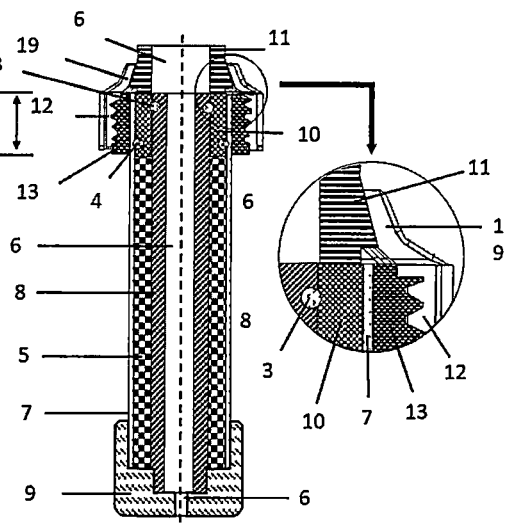
FIG. 9    FIG. 10
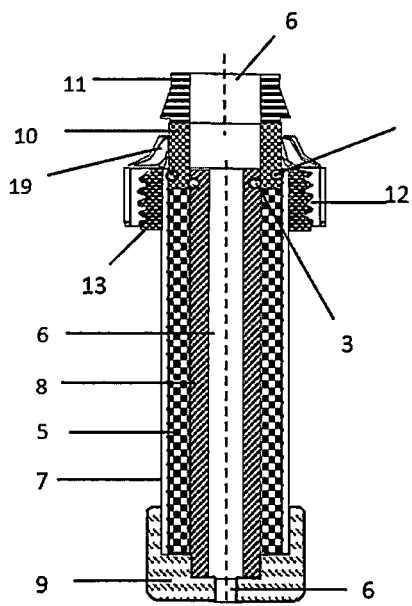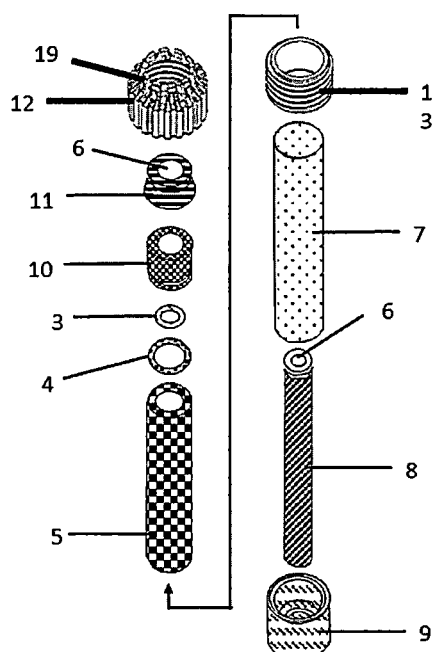
FIG. 11    FIG. 12
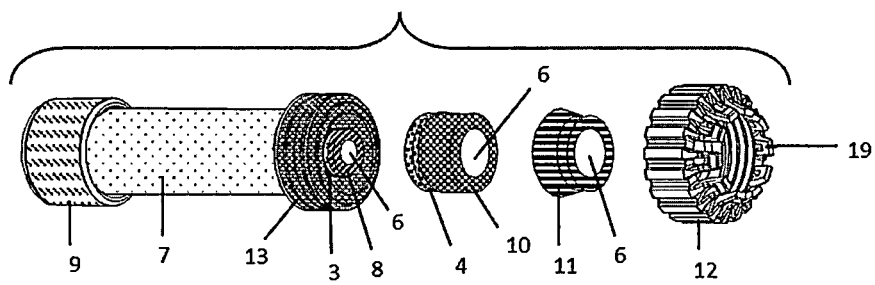
FIG. 13

METHOD, SYSTEM, AND APPARATUS TO PREVENT ELECTRICAL OR THERMAL-BASED HAZARDS IN CONDUITS

CROSS REFERENCE TO RELATED APPLICATIONS

This application is a continuation of U.S. patent application Ser. No. 16/377,982 filed Apr. 8, 2019, which is a continuation of U.S. patent application Ser. No. 15/873,311 filed Jan. 17, 2018, which is a divisional of U.S. patent application Ser. No. 15/472,103 filed Mar. 28, 2017.

BACKGROUND OF THE INVENTION

Systems which are in connectivity typically include an infrastructure comprised of mechanical framework and means for disconnecting, regulating, controlling, distributing, and modifying the conducted material. Electrical arc-faults in connectivity occur when the operating current exceeds normal bounds; such as caused by differences in expansion of the conduit and metal contacts, a manufacturing defect, or Ohmic heating caused by increased resistance of the conductor due to galvanic corrosion.

Electrical arc faults in electrical connectivity generate white hot plasma and intense heat. Arc faults can be caused, for example, by a manufacturing defect, overload, or thermal expansion and contraction at the joints by the thermodynamics of current on the conductor. There is a plethora of publicly available documents such as, "American Electricians Handbook" by T. Croft, F. Hartwell, and W. Summers (which is included in its entirety by reference herein), that teach electrical system designs and installations, as well as hazards related thereto. Other documents are publicly available that teach how to design systems that mitigate the related hazards with controllers, circuit breakers, ground fault detectors, and circuit interrupters.

For brevity, the following summary is focused on, but not limited to, systems comprised of conduits that conduct AC or DC electricity. The conduits are conventionally connected to metal lugs in a "junction box" or panel with connectors that provide connectivity, usually in a series fashion. The connectivity provides a path to a combiner box that aggregates. Several combiner boxes are often connected in a tree-like fashion for aggregating power into a transmission line. In practice, one or more combiner boxes include over-current protection and isolation means, such as relays, breakers, or insulated levers to deal with overloads and isolate safety hazards.

Briefly stated, the present invention is a device to provide autonomous disruption of connectivity without need for measuring temperature with thermometric sensors.

In the case of an arc occurring within connectivity, the intense heat generated can result in a localized fire of combustible material used in the connector's construction which quickly spreads to proximal combustible materials.

Ohmic heating, due to corrosion or loose connections, can also lead to an arc fault in junction boxes, combiner boxes, inverter boxes, and insulation within the electrical distribution system. The ohmic heating may also degrade the conductive material in a manner that when sufficient energy is present, an arc fault can be established in the conductive material itself.

Human trauma and electrocution can result by touching the metal frame and/or an associated electrically conductive structure of a system component, which is electrified by an arc fault. When the supporting energy of the arc fault is DC, there are no zero-crossings as in alternating current and the arc does not self-extinguish, but continues as long as sufficient energy exists.

There is a pressing need for an improved means described in detail in the present invention that acts autonomously to take action to prevent arc-faults from happening. It would therefore be desirable to provide an apparatus with means for pre-arc, unsafe-condition detection and mitigation therein that works even when voltages and currents are within normal limits. Further, the protection system would meet the 2014 National Electric Code (NEC) Handbook Section 690.11 and other NEC requirements (reference #1 in the list of non-patent documents, which is incorporated in its entirety by reference) by annunciating unsafe conditions in PV system equipment and associated wiring. The protection system would provide mitigation before the arc-fault occurs, shutting down the PV component with an unsafe condition; therefore preventing fire damage and human disasters by properly isolating only the unsafe component in a safe manner and alerting the system owner or consumer for replacement or reinstatement.

In preparing this application, a search of World Intellectual Property Organization (WIPO) member websites found over two hundred issued patents for detecting and protecting after electrical arc faults happen in chafing, overload, and wire short situations. None of these patents deal with methods or a system with means to pre-empt an arc fault hours, days, or even months before the discharge occurs. However, several patents and limitations thereof which are overcome by the present application are presented below.

There are numerous examples of prior art, including patents and publications that present principles, methods, systems, apparatus, and techniques for detecting and mitigating active arc-faults when they occur. There are numerous examples of art that teach detecting the arcing of a "load-side short," as experienced when electrical equipment fails, causing fuses to break due to current increase of electricity supplied by a generator or power facility. These methods cannot work well when sunlight is the energy source, as is the case with PV modules. This means a solar-source arc continues, due to the sun's rays (either direct or reflected from the moon), unless the module is covered somehow to occlude the sunlight; or the connectivity upstream is disrupted.

While there are numerous patents for detecting current overload, which causes fire in panels and electrical outlets, our search of the World Wide Web and the USPTO site patent database did not find issued U.S. patents or U.S. patent applications that teach direct mitigation of unsafe conditions without need for an electrical device such as a temperature sensor. Nor were there examples of prior art providing mitigation when current and voltage are within acceptable limits.

U.S. Pat. No. 8,410,950, issued to Takehara, et al. (referenced in the list of patent documents and which is incorporated in its entirety by reference herein), teaches an electronic monitoring module for measuring voltage and current of PV panel output, comparing measured values against minimum and maximum values saved in the monitoring module, and outputting an alarm signal when a measured value is outside a range defined by the minimum and maximum values. The invention this patent claims contains various electronic monitoring and electrical inverter components which differ it from the present patent.

H. Bruce Land III, Christopher L. Eddins, and John M. Klimek (Land, et al.), in a paper publicly available on the web entitled, "Evolution of Arc-Fault Protection Technology at APL," claims that an electrical fire is reported in the United States every five minutes. This paper (reference #9 in the list of non-patent documents and which is incorporated in its entirety by reference herein) documents that Applied Physics Laboratory (APL) created an automatic fire detection (AFD) system to detect and quench these fires. This paper also documents that APL developed electronically operated circuit breakers that are the follow-on to arc-fault circuit interrupter (AFCI) and ground fault interrupter (GFI) breakers.

U.S. Pat. No. 9,464,946 to Blemel et al. (referenced in the list of patent documents and which is incorporated in its entirety by reference herein) teaches using thermokinetic energy to forcibly open an electrical connector. The disruption mechanism in this patent stems from thermokinetic energy produced by heating of energetic materials as opposed to thermovolumetric, thermohydraulic, or thermoexpansive mechanisms listed in the present patent.

U.S. Pat. Publication No. 2016/0097685 to Blemel et al. (referenced in the list of patent documents and which is incorporated in its entirety by reference herein) teaches detection of state change in a thermomorphic material to detect an unsafe condition in connectivity. The disruption of the connectivity in the patent differs from the present patent in that no mention of thermohydraulic or thermovolumetric expansion mechanisms are made.

J. F. Sherwood in U.S. Pat. No. 2,815,642 (referenced in the list of patent documents and which is incorporated in its entirety by reference herein) teaches the use of the thermoexpansive properties of wax to produce hydraulic actuating pressure and eventually actuate a separate component. However, this invention requires a spring to compress the wax once cooled.

F. P. Mihm's U.S. Pat. No. 3,302,391 (referenced in the list of patent documents and which is incorporated in its entirety by reference herein) teaches a thermoresponsive material that expands when heated and pushes against a piston actuating a hydraulic force. The design in the listed patent utilizes a spring which enables the invention to return to a start position, whereas the present patent can only undergo actuation in a single direction.

Loveday et al. in U.S. Pat. Publication 2010/0095669 (referenced in the list of patent documents and which is incorporated in its entirety by reference herein) teach the thermoexpansion of wax to produce hydraulic force to an output shaft, thus providing means of displacement to a working object. The patent differs from the present patent in that a wax generator coupled to hydraulic transmission devices is required for operation. The present patent utilizes direct thermohydraulic or thermovolumetric force from a thermoexpansive substance optionally augmented by force from a thermokinetic substance as opposed to a transmitted force.

Sheppard et al. in U.S. Pat. No. 9,441,744 (referenced in the list of patent documents and which is incorporated in its entirety by reference herein) teaches a valve apparatus actuated by a thermoexpansive material. However, this invention differs from the present patent as the design requires a spring to compress the wax once cooled.

Lamb et al. in U.S. Pat. No. 6,988,364 B1 (referenced in the list of patent documents and which is incorporated in its entirety by reference herein) teaches the thermoexpansion of wax to push against a diaphragm and produce an actuation force. This differs from the present design as it utilizes a diaphragm.

Pat. No. GB663907 to Sherlock (referenced in the list of patent documents and which is incorporated in its entirety by reference herein) teaches motion of a thermally responsive element utilizing the volumetric expansion of wax and a rubber sealing recess. The patent claims a thermally responsive element comprising a rigid housing and a resilient member which transmits motion to a rod. The expansion of a wax within the rigid housing causes a displacement of the resilient member and thus the displacement of the rod. The apparatus in this patent differs from the designs in the present patent as the device is a reversible actuator with no mention of application to disruption nor connectivity systems.

U.S. Pat. No. GB748131 to Standard-Thomson Corp (referenced in the list of patent documents and which is incorporated in its entirety by reference herein) teaches improvements in or relating to resilient telescoping diaphragms which contain a liquid or wax which expands or contracts based on temperature changes. The claims of the patent state that the apparatus can be used for reciprocating motion and contains reciprocating elements. Further, the apparatus in question is primarily for use in thermostatic valves, which have discrete open and closed positions and can switch back and forth to those positions at specified temperatures.

U.S. Pat. No. 3,166,892 to Sherwood (referenced in the list of patent documents and which is incorporated in its entirety by reference herein) teaches the design and sealing of an actuator utilizing thermally expansible materials as a mode of motion. The design consists of a pressure chamber filled with a thermally expansible material which is heated by an electrical heating element enclosed within the chamber. The patent claims an actuator comprising a housing, pressure chamber, power producing material in the pressure chamber, and a piston shaft for reciprocal movement which utilizes an improvement of sealing and shaft-lubricating. A reciprocal design enables the control of the actuator in both the forward and reverse directions.

U.S. Pat. No. 7,922,694 to Harttiq (referenced in the list of patent documents and which is incorporated in its entirety by reference herein) teaches the design of a drive device for a piston in a container containing a liquid product. The patent claims a drive device for a piston in a container containing a liquid product, where the liquid product causes the extension of a piston in a longitudinal direction only. An actively varying shape is further claimed, enabling the piston device to operate with different cross-sectional shapes. The listed patent only describes an actuator which can move in forward and reverse directions, with no mention of utilization of actuation motion nor application to disruption of connectivity. The above patent utilizes a thermally expanding substance such as, but not limited to paraffin, in order to cause actuation. Two actuators are included in the design where the first and second actuators are used to cause a change in the shape of different segments.

The above inventions are meant for reversible actuation or forward and reverse motion.

U.S. Pat. Application No. 2005/0088272 to Yoshikawa et al. (referenced in the list of patent documents and which is incorporated in its entirety by reference herein) teaches the design of a thermal fuse incorporating a thermal pellet, which allows for a spring actuator to break an electrical connection at a specific temperature. The patent further teaches a method of producing said thermal pellet along with analysis and comparison of many polymeric materials which can serve as the thermal pellet material. Differentiation between this patent and the present patent is clear in that the present patent does not utilize springs nor a thermal pellet.

None of the above patents, patent applications, and publicly available prior art teach utilizing thermohydraulic substances to disrupt flow of electricity to mitigate an unsafe condition before sustained electrical arcing occurs.

The following summarizes advantages of the present invention over prior art. 1) The present invention provides means to utilize the ohmic heating phenomena which is symptomatic of progression leading to an electrical arc fault at a higher temperature; 2) can be added during manufacturing of the connector; 3) can be plugged-in during installation of connectivity; 4) can be added after the connectivity is installed to provide protection to existing systems; 5) has no electronic circuit which could fail; 6) has no electrical or mechanical contacts that make and break the connection; 7) can be embodied to cause disruption and eliminate further risk; 8) is easy to install or integrate into the connectivity; 9) is immune to producing false alarms due to naturally occurring RF emissions; 10) operates before there is a significant precursor change in voltage or current produced by an arc event; 11) is able to operate when repeated hot/cold cycles result in very low ampere electrical discharges across a sub-millimeter sized gap at joints within the connectivity component such as due to a factory defect in the connectivity component; or an installer does not make a proper connection causing a gap in the joint small enough to cause a self-extinguishing discharge which will subsequently result in an arc fault with associated high-temperature plasma energy.

The present invention differentiates from electrical arc fault protection devices that operate by detecting noise, radio frequency, light of plasma, or electromagnetic emissions of a discharge. The present invention also differentiates from electrical arc fault protection devices that operate by theomorphic principles and thermokinetic principles to detect heat of an active arc or a fire. Additionally, such existing means are not proactive.

The present invention differentiates from prior art in that it detects an electrical arc-fault by utilizing the thermovolumetric force generated by the heat associated with the hazardous condition to subsequently disrupt the flow.

The present invention omits the need for electronic modules and sensors used to recognize the artifacts of a live electrical arc fault, such as a flash of plasma, radio frequency emissions, current rise, or simultaneous voltage drop.

An advantage exists over thermal pellet-based thermal fuse designs in that thermal pellet based designs require a high degree of structural integrity from the thermal pellet as the thermal pellet acts as a structural barrier during normal operation of a thermal fuse. Furthermore, thermal fuses are produced for relatively low operating current and voltage. No indication is visible when a thermal fuse has activated, making troubleshooting more cumbersome.

The present invention has an advantage over designs which contain springs. Springs apply a constant force to the walls and components within the body of a design. Spring-based devices require higher structural integrity and the spring can also act as a pathway for electricity to flow in the event of a severe arc fault. Elevated temperature conditions can further affect the lifetime of spring containing devices as the structural integrity of a spring containing body is significantly reduced at regional hot weather temperatures.

For a disruptor, many advantages exist over the prior art in that many of the previously listed devices are classified as actuators. Actuators can have an open and closed position, or can be used for precise positioning. In this sense, actuators are considered to be reversible because they can be used to return to their original positions. Reciprocable or reciprocating actuators are designed to open and close frequently and reliably. Applications which use reciprocable actuators have the need to switch directions of motion. A thermoexpansive disruptor only ever needs to cause motion a singular time in one direction. For use as a safety device in arc-fault hazards, a non-reversible disruptor prevents reconnection of a connectivity while ensuring tampering with the device will not result in a hazard.

Thermal fuses, which are designed to cause a break in an electrical circuit, employ the use of metallic springs coupled to thermally-sensitive materials. The nature of a thermal fuse requires that an included spring be under constant tension or compression. Activation of a thermal fuse occurs when the thermally-sensitive material degrades and is allowed to structurally deform. The structural changes in the thermally-sensitive material allow for the motion of the metallic spring into a lower-energy position. Thermal fuses are irreversible single-use devices where the metallic spring is unable to be reset to a zero position. Conventional thermal fuses are designed for low-power applications where there is little risk of an arc-fault occurring. Because of the number of metallic components in a thermal fuse, arcing is more likely to occur, using the metallic springs as conducting pathways. Being fully enclosed and sealed devices, thermal fuses have no indication that a break in an electrical circuit has occurred.

BRIEF SUMMARY OF THE INVENTIONS

The present application teaches a protection apparatus that utilizes a thermovolumetric expansion force as a means for improving the safety of electrical, chemical, and other distribution systems from the damage and hazard that is unrecognized by ordinary means, and which will eventually result in an electrical arc with resulting fire, electrical shock, or hazard to life. The focus herein is on applying the protection apparatus to associated connectivity wherein thermovolumetric force mitigates the risk of a future arc fault, enabling mitigation of the condition before the unsafe event occurs.

The present application describes use of a thermovolumetric expansion force due to temperature change, while enabling isolation of unsafe conditions in virtually any system connectivity component.

As an example, the degree of heat generated by flow of electricity in a system is represented by the relationship Ohmic Energy=Current*Resistance (E=I*R). The relationship means that either increased resistance or increased current would eventually result in a DC arc with the hazards.

While the present specification uses the example of photovoltaic balance of system connectors to teach the principles, a person familiar with electrical systems would realize that connectivity devices are components found in pipelines that conduct gasses, petroleum, and sundry chemicals as well as conduits and electrical systems.

BRIEF DESCRIPTION OF DRAWINGS

FIG. 7 depicts two sections of the connectivity in a separated cutaway view with a thermovolumetric substance within a cavity between an outer sleeve and an inner column.

FIG. 9-FIG. 13 depict another embodiment wherein the embodiment shown in FIG. 5-FIG. 8 is augmented with a number of components forming a mechanism to prevent reconnection of the connectivity after disconnection occurs.

FIG. 9 depicts an isometric view of an assembled connectivity disruptor containing a thermovolumetric substance.

FIG. 10 depicts a cutaway perspective view of a connectivity disruptor design containing a thermovolumetric substance contained within a cavity between an outer sleeve and an inner column, sealed on one end by a cap and plugged at the opposite end by a sliding ring barrier sealed against the outer sleeve and inner column by O-rings.

FIG. 11 depicts a cutaway perspective of a connectivity disruptor containing a thermovolumetric substance contained within a cavity between an outer sleeve and an inner column after volumetric expansion of the thermovolumetric substance has occurred, causing disconnection of the connectivity.

FIG. 12 depicts an exploded view of an isometric perspective of the connectivity design in which the threaded collar and retaining ring are added to the connector design.

Various embodiments of the invention are disclosed in the following detailed description and accompanying drawings. Each drawing teaches how to implement the techniques and/or components to affect the purposes of this patent.

DETAILED DESCRIPTION OF THE INVENTIONS

Figure 1:
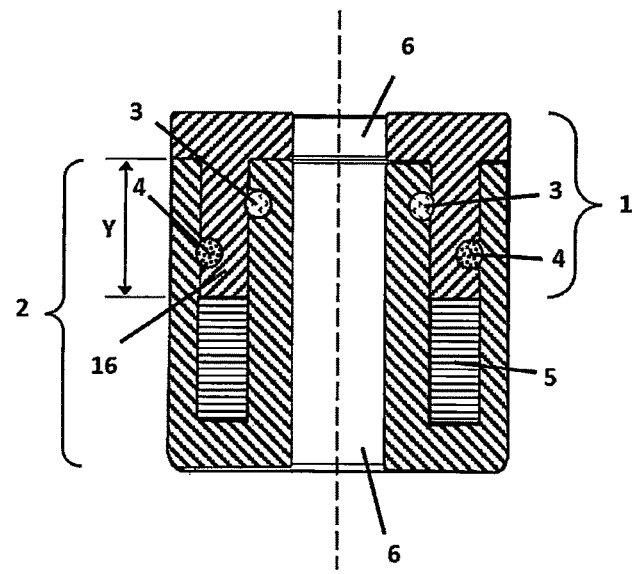
FIG. 1-FIG. 4 are cutaway assembly drawings depicting an embodiment of the current invention.

FIG. 1-FIG. 4 are cutaway assembly drawings that depict an embodiment of the current invention. FIG. 1 depicts a cutaway view of a fully assembled connectivity design where a thermovolumetric-substance (5) is enclosed within the connectivity body. The image teaches how the components of the connectivity will be arranged when fully assembled. A total of five components are used in the assembly of this connectivity design. Two components comprise the main body of the connectivity, two components act as sealing mechanisms, while the final component is the substance that expands upon heating. The dimension 'Y' represents the displacement distance which the thermovolumetric substance (5) will cause the upper portion of the connectivity to undergo during heating causing disconnection of the connectivity. A hollow cylindrical-cavity (6) is present in the center of this connectivity design and is marked by a dashed line. In a completed connectivity design, this hollow cavity (6) would be the location in which the conductive guides are placed within the connectivity.

Figure 2:
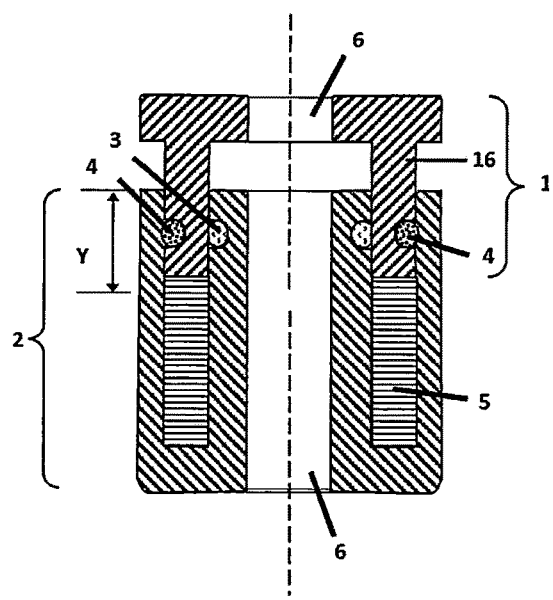

FIG. 2 depicts a cutaway view of a fully pieced-together connectivity design after expansion of the thermovolumetric substance (5) has occurred causing disconnection of the connectivity. The image teaches how the positions of the connectivity components will change in response to expansion of the thermovolumetric substance (5). The hollow cylindrical cavity (6), which is marked by dashed lines in the figure, has been separated into two separate locations. This is to show that in a completed connectivity design, the conductive guides within the connectivity would be separated into two isolated components, thereby preventing conduction within the connectivity.

Figure 3:
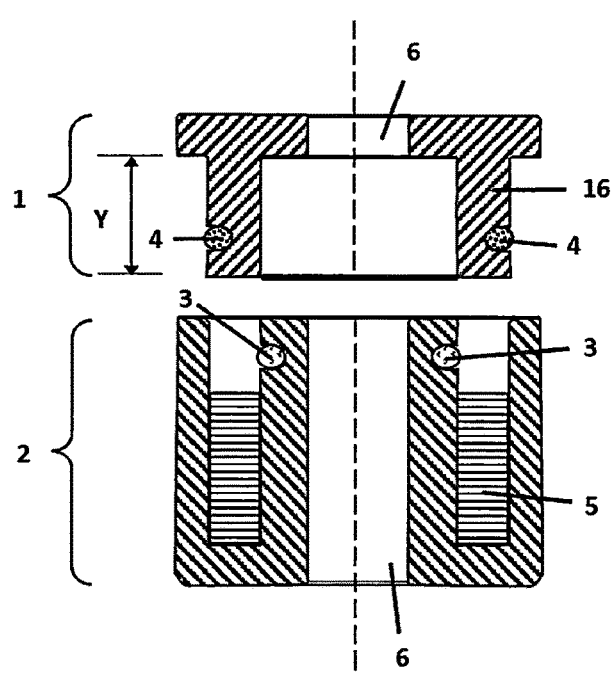

FIG. 3 depicts a view of the connectivity in which the connectivity has been separated into two distinct component groups as they would be arranged before assembly of the connectivity. The first component group, which is shown in FIG. 3 to be located above the second component group, is comprised of an end cap (1) to which an outer O-ring (4) is affixed within a groove at the lowermost portion of the end cap (1). A hollow cavity (6) is present at the center of the end cap (1) and is marked by a dashed line. This hollow cavity (6) marks where a segment of the conductive guide would be located within the connectivity component group before assemblage of the connectivity has occurred. The second component group is comprised of a reservoir piece (2) that holds the thermovolumetric substance (5) within a ring-shaped cavity surrounding an inner hollow cavity (6). The hollow cavity (6) is marked with a dashed line and represents the location where the remainder of the conductive guide would be located in the second component group before assemblage of the connectivity has occurred. An inner O-ring (3) is located at the uppermost portion of the reservoir piece (2) and is affixed within a groove set within the inner boundary of the ring-shaped cavity.

Figure 4:
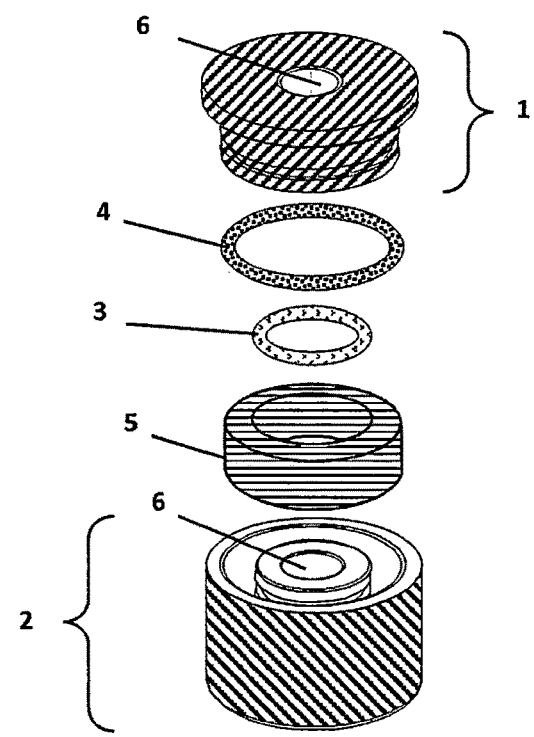

FIG. 4 depicts an exploded isometric view of this version of the connectivity. This figure shows the overall design of the individual components and provides a guide for how the components would be sized relative to one another and the order in which they would be arranged during assembly of the connectivity.

Figure 5:
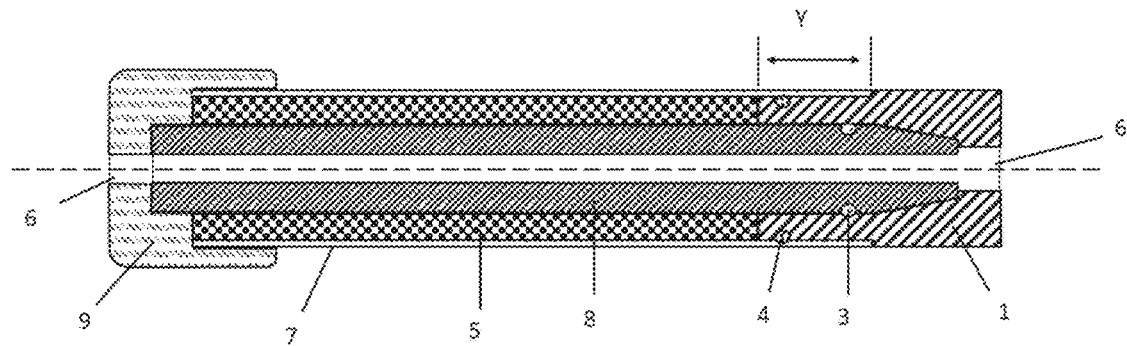
FIG. 5-FIG. 8 depict an embodiment wherein the connectivity is enlarged to accommodate greater expansion distances.

FIG. 5 depicts an embodiment wherein the connectivity is enlarged to accommodate greater expansion distances and designed so that it could be more easily fabricated. It is a cutaway assembly drawing. FIG. 5 depicts a cutaway perspective view of another version of an embodiment in which a thermovolumetric substance (5) is contained within a ring-shaped cavity inside the connectivity. In this design, instead of being a continuous part, the reservoir piece (2) has been divided into three components in order to simplify production of the individual connectivity components. The overall size of this design is also significantly larger than the design depicted in FIG. 1-FIG. 4 in order to accommodate a larger volume of the thermovolumetric substance (5). This design contains a hollow internal cavity (6) that passes through three of the connectivity components. These hollow cavities (6) are marked by a dashed line and represent the location that the conductive guide would be placed within the completed connectivity design. This design makes use of two O-rings (3) and (4) to provide a sliding seal at one end of the chamber within the connectivity that contains the thermovolumetric substance (5). These O-rings (3) and (4) create seals between the end cap (1) and the outer sleeve (7) and between the end cap (1) and the inner column (8).

Figure 6:
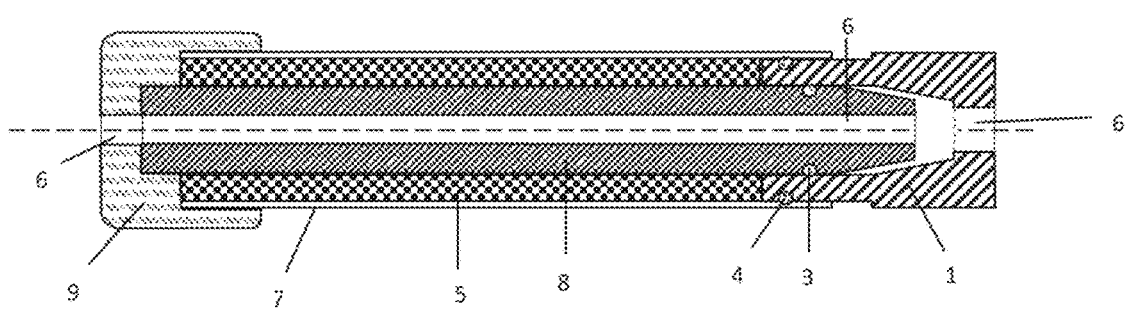

FIG. 6 depicts two sections of the connectivity in a separated cutaway view containing a thermovolumetric substance (5) within a cavity between an outer sleeve (7) and an inner column (8) after expansion of the volumetric substance has occurred causing disconnection of the connectivity. The image teaches how the positions of the connectivity components will change in response to expansion of the thermovolumetric substance (5). The hollow cylindrical cavity (6) has been separated into two separate locations which are marked by dashed lines in the figure. This is to show that in a completed connectivity design the conductive guide within the connectivity would be separated into two isolated components thereby preventing conduction within the connectivity.

Figure 7:
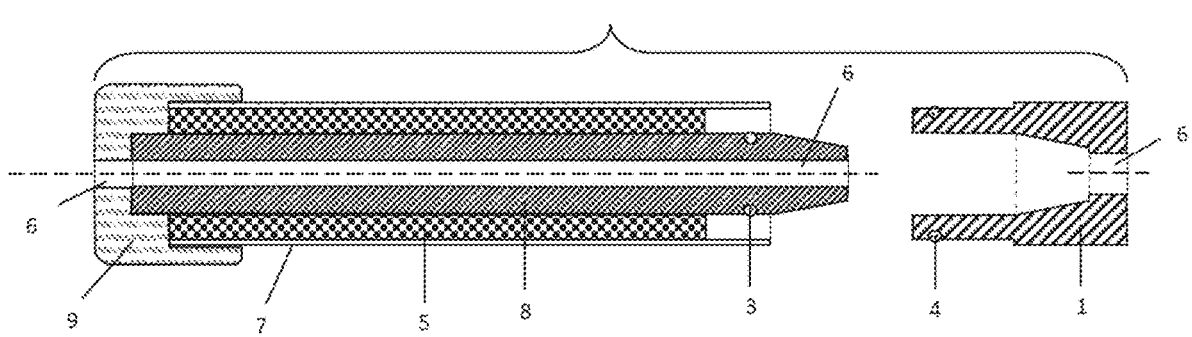

FIG. 7 depicts two sections of the connectivity in a separated cutaway view with a thermovolumetric substance (5) within a cavity between an outer sleeve (7) and an inner column (8). This figure depicts the connectivity separated into two component groups as they would be arranged before assembly of the connectivity. During assemblage of the connectivity, the two component groups of the connectivity are fitted together such that a conductive guide passes through the region noted by the dashed lines. During heating and subsequent expansion of the thermovolumetric substance (5), the same two component groups of the connectivity will be caused to separate due to hydraulic pressure and thus cause disconnection of the connectivity.

Figure 8:
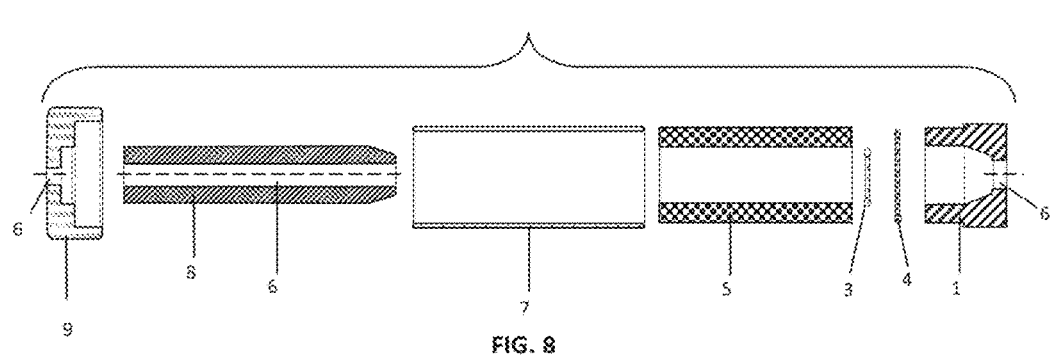

FIG. 8 teaches the basic components of the connectivity using an exploded cutaway view. This figure shows the overall design of the individual components and provides a guide for how the components would be sized relative to one another and the order in which they would be arranged during assembly of the connectivity.

FIG. 9 depicts another embodiment wherein the embodiment shown in FIG. 5-FIG. 8 is augmented with a number of components forming a mechanism to prevent reconnection of the connectivity after disconnection occurs. In this design, the end cap (1) component seen in the embodiment shown in FIG. 5-FIG. 8 is separated into two components to allow for connection and disconnection of the conductive guide components housed within the stopper (11) and the inner column (8) while the thermovolumetric substance (5) (not shown) remains in a fully sealed state within the other connectivity components. FIG. 9 is an assembly drawing of the embodiment. FIG. 9 depicts an isometric view of an assembled connectivity disruptor containing a thermovolumetric substance (5) (not shown). This design is outfitted with a retaining ring (12) and threaded collar (13) (not shown) to allow for one-way actuation upon expansion of the thermovolumetric substance (5) (not shown) contained within the connector.

FIG. 10 depicts a cutaway perspective view of a connectivity disruptor design containing a thermovolumetric substance (5) contained within a cavity between an outer sleeve (7) and an inner column (8), sealed on one end by an end barrier (9) and plugged at the opposite end by a sliding ring barrier (10) sealed against the outer sleeve (7) and inner column (8) by O-rings (3) and (4). The dashed line at the center of the figure marks the region through which a conductive guide would pass. The connectivity disruptor in this figure is outfitted with a threaded collar (13) attached to the outer wall of the device to which a retaining ring clip (19) has been secured. A magnified view of the interface between the retaining ring (12), and the angled portion of the stopper (11) can also be seen in this figure.

FIG. 11 depicts a cutaway perspective of a connectivity disruptor containing a thermovolumetric substance (5) contained within a cavity (6) between an outer sleeve (7) and an inner column (8) after volumetric expansion of the thermovolumetric substance (5) has occurred causing disconnection of the connectivity. The figure teaches how the positions of the connectivity components will change in response to expansion of the thermovolumetric substance (5). The hollow cylindrical cavity (6) has been separated into two separate locations which are marked by dashed lines in the figure. This is to show that in a completed connectivity design, the conductive guide within the connectivity would be separated into two isolated components thereby preventing conduction within the connectivity. This figure also teaches how reconnection of the connectivity would be prevented after disconnection has occurred. Once volumetric expansion of the thermovolumetric substance (5) has caused the stopper (11) component to be forced through the retaining ring (12), the design of the stopper (11) and the retaining ring (12) is such that the stopper (11) cannot be forced through the retaining ring (12) in the direction opposite which it was forced by the thermovolumetric substance (5).

FIG. 12 depicts an exploded view of an isometric perspective of the connectivity design in which the threaded collar and retaining ring are added to the connector design. The figure depicts how the assorted parts align with one another and are proportionally sized compared to one another to allow for assembly of the connectivity.

FIG. 13 is a separated isometric view of the connectivity embodiment that employs a retaining ring (12) that attaches to a threaded collar (13). During axial expansion of the thermovolumetric substance (5) (not shown), the attachment of the retaining ring (12) to the lower component housing produces one-way actuation of the stopper (11) and subsequently permanent disconnection of the connectivity when the stopper (11) is forced through the retaining ring clips (19) attached to the retaining ring (12). The depicted disruptor connector embodiment comprises: 1) a lower housing containing the thermovolumetric substance (5) (not shown) and part of the conductive guide through the connector; 2) a sliding ring barrier (10) that sits in the lower body and is acted upon by force of expansion of the thermovolumetric substance (5) (not shown) to cause actuation; 3) a stopper (11) that is shaped so that linear actuation of the sliding ring barrier (10) results in the stopper (11) being forced through the retaining ring (12); 4) a retaining ring (12) that threads onto the lower housing of the connectivity. The stopper (11) in the design would house the remainder of the conductive guide through the connector that is not contained within the lower housing. The shape of the retaining ring (12) component is such that it prevents the stopper (11) from returning to its original position after actuation has occurred.

Figure 14:
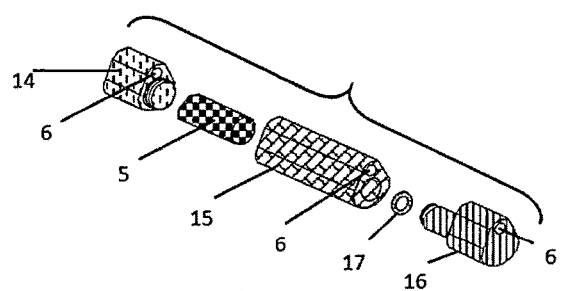
FIG. 14 is a cutaway assembly drawing of another exemplary embodiment.

FIG. 14 is a cutaway assembly drawing of another exemplary embodiment. FIG. 14 depicts an exploded isometric diagram of alternate conceptual design for the connectivity disruptor in which the thermovolumetric substance (5) is located offset from the conductive guide instead of surrounding the conductive guide. In this example, the connectivity disruptor is comprised of a threaded connection piece (14) which screws into an assembly in which the thermovolumetric substance (5) is placed prior to the attachment of the threaded piece (14), and a piston connection piece (16) which acts as the component of the design that would be actuated by volumetric expansion of the thermovolumetric substance (5). In this design, part of the conductive guide would be contained within the joined threaded connection piece (14) and central cavity housing (15) while the remainder of the conductive guide would be contained within the piston connection piece (16).

Figure 15:
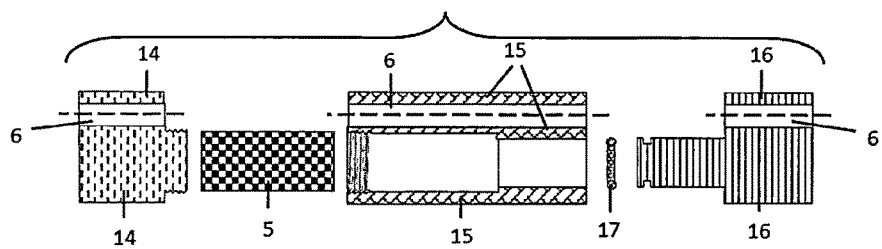
FIG. 15 depicts an exploded cross-sectioned diagram with an offset thermovolumetric substance internal to the connectivity disruptor construction.

FIG. 15 depicts an exploded cross-sectioned diagram with an offset thermovolumetric substance (5) internal to the connectivity disruptor construction. The connectivity disruptor embodiment is comprised of 1) a threaded connection piece (14) which screws into a central cavity housing (15) sealing the thermovolumetric substance (5); 2) a central cavity housing (15) in which the thermovolumetric substance (5) is placed prior to the attachment of the threaded connection piece (14); and 3) a piston connection piece (16) which acts as the component of the design that would be actuated by volumetric expansion of the thermovolumetric substance (5). In this embodiment, the thermovolumetric substance (5) is secured within a cavity formed by the joining of the threaded connection piece (14) to the central cavity housing (15). The piston connection piece (16) is designed such that the piston portion of the component is sized properly to fit within the piston cavity of the central cavity housing (15). An O-ring secured in a groove on said piston acts to fully seal the thermovolumetric substance (5) within the central cavity housing (15) cavity before and after thermovolumetric expansion of the thermovolumetric substance (5). Before thermovolumetric expansion of the thermovolumetric substance (5) the conductive guide components which would be housed within the hollow cavities in the threaded connection piece (14), the central cavity housing (15), and the piston connection piece (16) would be joined together so that a conductive state exists within the connectivity. After expansion of the thermovolumetric substance (5), the piston connection piece (16) is forced out of its original position within the central cavity housing (15) by the hydraulic force exerted by the thermovolumetric expansion of the thermovolumetric substance (5). This results in separation of the conductive guide components housed within the hollow cavity regions in the threaded connection piece (14), the central cavity housing (15), and the piston connection piece (16) resulting in disruption of the conductive state which exists prior to thermovolumetric expansion of the thermovolumetric substance (5).

Figure 16:
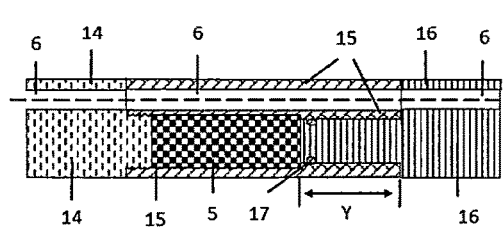
FIG. 16 depicts a cross-sectional view of the offset thermovolumetric substance connectivity design while it is in its fully-assembled state.

FIG. 16 depicts a cross-sectional view of the offset thermovolumetric substance (5) connectivity design while it is in its fully-assembled state. When fully-assembled, the thermovolumetric substance (5) is sealed within a cavity inside the middle housing that is sealed at one end by the threaded connection piece (14) and at the opposite end by the insertion of the piston component into the central cavity housing (15). A seal is created between the piston component and the central cavity housing (15) by the presence of an O-ring (17) set into a groove on the end of the piston component shown closest to the thermovolumetric substance (5). The dashed line along the offset pathway at the top of the figure marks the region through which a conductive guide would pass.

Figure 17:
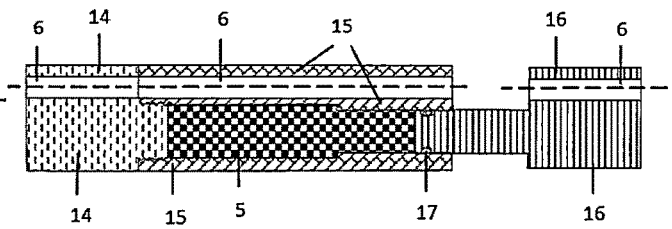
FIG. 17 depicts a cross-sectional view of the offset thermovolumetric substance connectivity design while it is in its actuated state.

FIG. 17 depicts a cross-sectional view of the offset thermovolumetric substance (5) connectivity design while it is in its actuated state. The figure teaches how the positions of the connectivity components will change in response to expansion of the thermovolumetric substance (5). The hollow cylindrical cavity (6) has been separated into two separate locations which are marked by dashed lines in the figure. The dashed lines are used to show that in a completed connectivity design, the conductive guide within the connectivity would be separated into two isolated components thereby preventing conduction within the connectivity.

Figure 18:
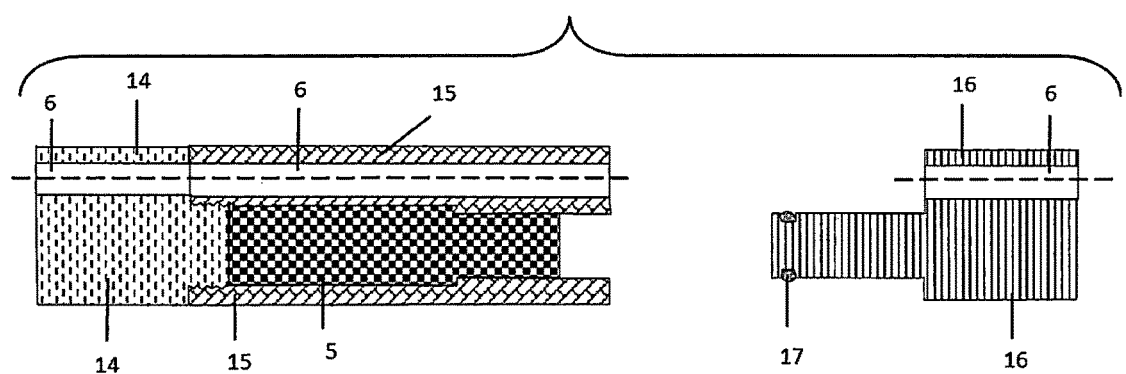
FIG. 18 depicts a cross-sectional view of the separated offset thermovolumetric substance design.

FIG. 18 depicts a cross-sectional view of the separated offset thermovolumetric substance (5) design. This figure depicts the configuration of the components of the design upon separation due to heating and subsequent expansion of the thermovolumetric substance (5). In this configuration, the connectivity is separated into two component groups, the group on the left of the figure comprised by the threaded connection piece (14) which remains affixed to the central cavity housing (15) and the group on the right of the figure comprised of the piston connection piece (16) and the O-ring (17) that would have acted to seal the thermovolumetric substance (5) within the middle housing cavity during the separation process. The dashed lines along the offset pathway at the top of the figure mark the regions through which a conductive guide would pass and how the conductive guide would be separated after actuation has occurred.

Figure 19:
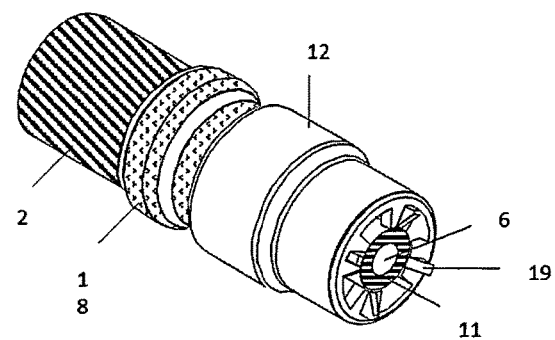
FIG. 19 depicts another embodiment wherein the component is outfitted with yet another design of retaining ring.

FIG. 19 depicts another embodiment wherein the component is outfitted with yet another design of retaining ring (12). It is an assembly drawing. FIG. 19 depicts an isometric view of an assembled connectivity design containing a thermovolumetric substance (5) (not shown). The component is outfitted with a different design of retaining ring (12) that allows for one-way movement of the stopper (11) component to occur via internal retaining clips (not pictured in figure) and also retains the stopper (11) within the retaining ring (12) after actuation via expansion of the thermovolumetric substance (5) (not shown) has occurred.

Figure 20:
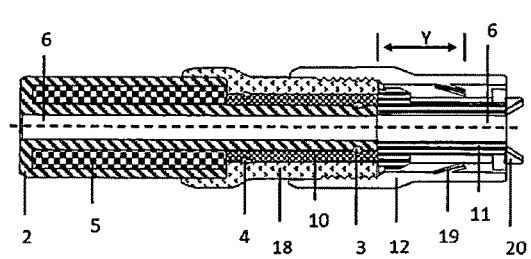
FIG. 20 depicts a cross-sectional view of an assembled connectivity design in which the thermovolumetric substance is held within a region created by assemblage of a reservoir piece and a ring barrier housing.

FIG. 20 depicts a cross-sectional view of an assembled connectivity design in which the thermovolumetric substance (5) is held within a region created by assemblage of a reservoir piece (2) and a ring barrier housing (18). In this design, a larger volume of a thermovolumetric substance (5) can be contained within the connectivity thus allowing for higher actuation distances of the sliding ring barrier (10) to be achieved. In this design, the sliding ring barrier (10) is contained within the ring barrier housing (18) and has an outer O-ring (4) mounted in a groove along the outer edge of the sliding ring barrier (10) nearest the thermovolumetric substance (5) that creates a seal between the sliding ring barrier (10) and the ring barrier housing (18). An inner O-ring (3) is located in a groove at the end of the reservoir piece (2) furthest from the thermovolumetric substance (5). This inner O-ring (3) creates a seal between the reservoir piece (2) and the sliding ring barrier (10). An alternate model of retaining ring (12) that allows for retention of the stopper (11) component after actuation has occurred is included in this design. The retaining ring (12) is secured onto the ring barrier housing (18). The stopper (11) component in this design is modified such that it has guide fins (20) that cause it to remain centered within the retaining ring (12) during motion resulting from actuation of the thermovolumetric substance (5). Retaining ring clips (19) within the retaining ring (12) would act to hold the stopper (11) within the retaining ring (12) after the desired actuation distance (Y) has been achieved.

Figure 21:
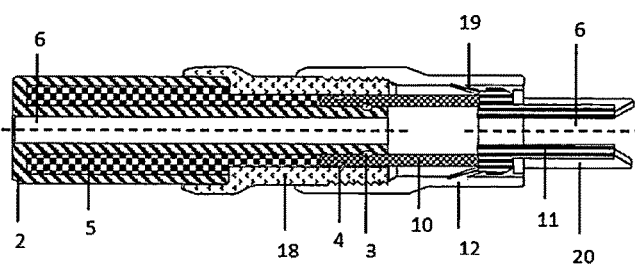
FIG. 21 depicts a cross-sectional view of a connectivity design in which the thermovolumetric substance is held within a region created by assemblage of a reservoir piece and a ring barrier housing.

FIG. 21 depicts a cross-sectional view of a connectivity design in which the thermovolumetric substance is held within a region created by assemblage of a reservoir piece (2) and a ring barrier housing (18). This figure shows the configuration of the connectivity after volumetric expansion of the thermovolumetric substance (5) has occurred resulting in actuation of the sliding ring barrier (10) and thus actuation of the stopper (11) into the retaining ring (12). It can be seen in this figure that volumetric expansion of the thermovolumetric substance (5) has resulted in it expanding into the region between the ring barrier housing (18) and the inner portion of the reservoir piece (2). In this figure, the stopper (11) has been moved into the retaining ring (12) past the retaining ring clips (19) and thus contained inside the retaining ring (12) between the retaining ring clips (19) and the shell of the retaining ring (12).

Figure 22:
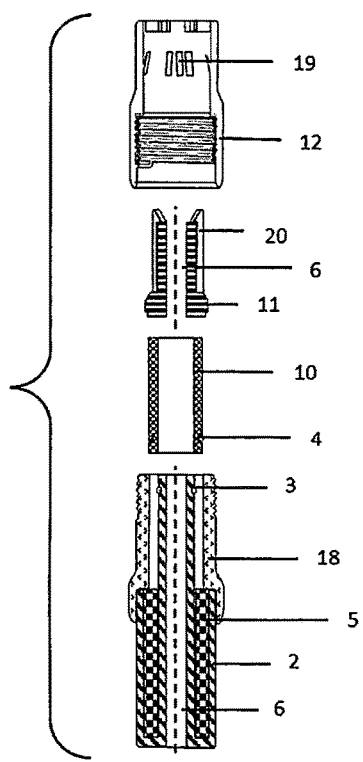
FIG. 22 depicts a cross-sectional view of a connectivity design in which the thermovolumetric substance is held within a region created by assemblage of a reservoir piece and a ring barrier housing in which the connectivity has been separated into two components (the top two sections depicted) and two component groups (the bottom two sections depicted).

FIG. 22 depicts a cross-sectional view of a connectivity design in which the thermovolumetric substance (5) is held within a region created by assemblage of a reservoir piece (2) and a ring barrier housing (18) in which the connectivity has been separated into two components (the top two sections depicted) and two component groups (the bottom two sections depicted). The top component is the retaining ring (12) with retaining ring clips (19), the second component is the stopper (11) with guide fins (20), and the third section is a component group comprised of the sliding ring barrier (10) and the outer O-ring (4), while the bottom section is a second component group comprised of the reservoir piece (2), the thermovolumetric substance (5), the ring barrier housing (18), and the inner O-ring (3).

Figure 23:
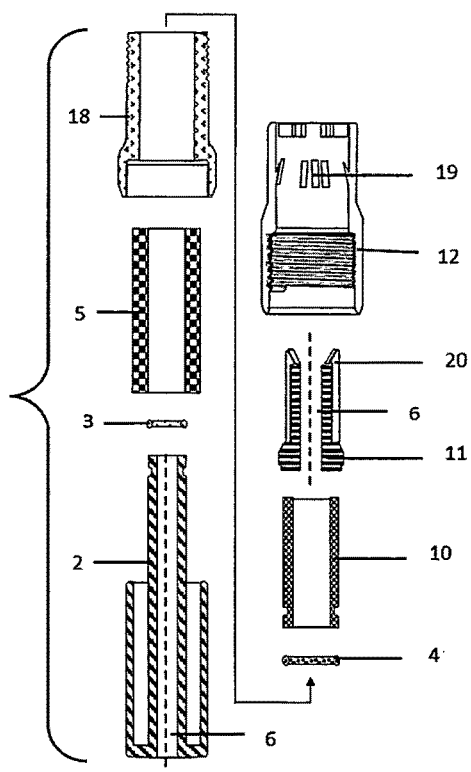
FIG. 23 depicts an exploded cross-sectional view of a connectivity design in which the thermovolumetric substance is held within a region created by assemblage of a reservoir piece and a ring barrier housing.

FIG. 23 depicts an exploded cross-sectional view of a connectivity design in which the thermovolumetric substance (5) is held within a region created by assemblage of a reservoir piece (2) and a ring barrier housing (18). An alternate model of retaining ring that allows for retention of the stopper (11) component after actuation has occurred is included in this design. The figure depicts how the assorted parts align with one another and are proportionally sized compared to one another to allow for assembly of the connectivity.

(1) End cap
(2) Reservoir piece
(3) Inner O-ring
(4) Outer O-ring
(5) Thermovolumetric substance
(6) Hollow cavity
(7) Outer sleeve
(8) Inner column
(9) End barrier
(10) Sliding ring barrier
(11) Stopper
(12) Retaining ring
(13) Threaded collar
(14) Threaded connection piece
(15) Central cavity housing
(16) Piston connection piece
(17) O-ring
(18) Ring barrier housing
(19) Retaining ring clips
(20) Guide fins Referring now to FIG. 1, FIG. 1 depicts a thermovolumetric substance (5) inside of a reservoir piece (2) will expand by a distance notated by (Y). Within the reservoir piece (2) is a hollow cavity (6) into which components of a conductive guide will be placed. Upon ohmic heating, which occurs inside of the hollow cavity (6) or even outside of the connectivity disruptor embodiment as a whole, the thermovolumetric substance (5) undergoes volumetric expansion producing a hydraulic force that causes separation of the end cap (1) and the reservoir piece (2). As thermovolumetric substances may be in the form of liquids or may convert into a liquid state upon heating, an inner O-ring (3) and an outer O-ring (4) are used as sealing mechanisms for the thermovolumetric substance (5) in order to ensure that leakages do not occur. Should a solid material be used in place of a liquid thermovolumetric material, the O-rings would be unnecessary.

Referring now to the connectivity disruptor embodiment depicted in FIG. 2, FIG. 2 displays the connectivity disruptor embodiment after heating of the thermovolumetric substance (5) has caused its volumetric expansion resulting in separation of the end cap (1) and the reservoir piece (2). In this state, the hollow cavity (6) has been caused to separate into two distinct regions. In a completed connectivity disruptor embodiment design, such a separation would have resulted in separation of the conductive guide through the connectivity, thus causing disconnection of the connectivity. The thermovolumetric expansion of the thermovolumetric substance (5) results in the generation of a hydraulic force within the connectivity. In order to prevent a reduction of said hydraulic force via leakage of the thermovolumetric substance (5) out of the connectivity in the event that the thermovolumetric substance (5) is a liquid or undergoes a phase transformation into a liquid state, an inner O-ring (3) is used to seal the reservoir piece (2) against the inner surface of the end cap (1) and an outer O-ring (4) is used to seal the reservoir piece (2) against the outer surface of the end cap (1).

Referring now to the embodiment in FIG. 3, FIG. 3 shows the component before assemblage of the connectivity has occurred, the connectivity disruptor embodiment can be seen as being comprised of two component groups. The first component group is comprised of the end cap (1) and the outer O-ring (4). This component group would provide a housing for a portion of the conductive guide through the assembled connectivity. The conductive guide component housed in this component group would reside in the hollow cavities (6) marked with a dashed line in the figure inside the end cap (1). The second component group is comprised of the reservoir piece (2), the inner O-ring (3), and the thermovolumetric substance (5). This component group would provide a housing for the remainder of the conductive guide through the connectivity. The conductive guide component housed in this component group would reside in the hollow cavities (6) marked with a dashed line inside the reservoir piece (2). Upon joining of the first and second component groups, the first component group's insertion into the lower component group creates a tight but slidable seal that retains the thermovolumetric substance (5) within the connectivity before and during thermovolumetric expansion.

Referring now to FIG. 4, FIG. 4 depicts the connectivity disruptor embodiment components placed in an exploded isometric view, where the end cap (1) and the reservoir piece (2) are seen to possess hollow cavities (6) that align with one another in the design to provide a region through which a conductive guide would pass through the connectivity. The reservoir piece (2) requires the placement of the thermovolumetric substance (5) into the reservoir piece (2) before assembly of the connectivity. In order to assure retention of the thermovolumetric substance (5) within the connectivity both prior to and during thermovolumetric expansion of the thermovolumetric substance (5) an inner O-ring (3) is used to seal the inner surface of the end cap (1) against the reservoir piece (2) and an outer O-ring (4) is used to seal the outer surface of the end cap (1) against the reservoir piece (2).

Referring now to FIG. 5 which depicts an alternate embodiment; FIG. 5 depicts a thermovolumetric substance (5) which is sized to that of the cavity that exists in the region between an outer sleeve (7) and an inner column (8) such that it fully fills the region to allow for a minimized air gap between the thermovolumetric substance (5) and an end cap (1). The thermovolumetric substance (5) fully surrounds the inner column (8). The region containing the thermovolumetric substance is sealed via a permanently affixed end barrier (9) at the left end of the connectivity disruptor embodiment and with an inner O-ring (3) and an outer O-ring (4) at the right end of the connectivity that seal the end cap (1) against the outer sleeve (7) and the inner column (8). The inner O-ring (3) sits in a groove on the inner column (8) and compresses against the inner surface of the end cap (1) at the right end of the outer sleeve (7), while the outer O-ring (4) sits in a groove on the outer surface of said end cap (1) and compresses against the outer sleeve (7). A hydraulic force generated by a volumetric expansion of the thermovolumetric substance (5) within the cavity that exists in the region between the outer sleeve (7) and the inner column (8) which would cause the end cap (1) at the right end of the connectivity to be forced out of the outer sleeve (7), thereby causing a linear actuation a distance (Y). In the completed connector design, a conductive guide would be contained within the connectivity in a hollow cavity (6) marked in the figure by a dashed line. Part of this conductive guide would be contained in the hollow cavity (6) inside the end cap (1) while the remainder of the conductive guide would be placed within the hollow cavity (6) that passes through the inner column (8) and an end barrier (9). The actuation of the end cap (1) by volumetric expansion of the thermovolumetric substance (5) would thereby cause a disconnection of the connectivity by separating the components of the conducting guide within the connectivity a distance Y.

Referring now to FIG. 6, FIG. 6 shows the assemblage wherein the thermovolumetric substance (5) has expanded as a result of heating. The thermovolumetric substance (5) has undergone a volumetric expansion within the hollow cavity (6) that exists in the region between the outer sleeve (7) and the inner column (8). This results in creation of hydraulic pressure due to the hollow cavity (6) between the outer sleeve (7) and the inner column (8) being sealed at the left end by the permanently affixed end barrier (9) and on the right end by the end cap (1) which is sealed against the inner column (8) by the inner O-ring (3) and against the outer sleeve (7) by the outer O-ring (4). This hydraulic pressure causes the end cap to be forced out of the region between the outer sleeve (7) and the inner column (8) resulting in separation of the hollow cavity (6) from one continuous cavity into two separate cavities. In the completed connector design, the conductive guide would be installed in these two separate hollow cavities in such a way that a continuous conductive guide exists before actuation of the connectivity occurs. After actuation occurs, this conductive guide would be separated into two segments, thus preventing conduction. This would be the state of disconnection of the connectivity disruptor embodiment depicted in FIG. 6.

Referring now to FIG. 7, FIG. 7 depicts the connectivity disruptor embodiment as a whole being comprised of two component groups. These component groups are forced apart during the thermally induced volumetric expansion of the thermovolumetric substance housed in the region between the outer sleeve (7) and the inner column (8). The first component group is seen on the left of the figure and is comprised of the end barrier (9) which is permanently affixed to the outer sleeve (7) and the inner column (8), the inner O-ring which is set in a groove that is at the rightmost end of the inner column (8), and the thermovolumetric substance (5) which is placed in the region that exists between the outer sleeve (7) and the inner column (8). The hollow cavity (6), marked by a dashed line in the first component group, marks the region through which part of the conductive guide would be located within the connectivity. The second component group seen on the right side of the figure is comprised of the end cap (1) and the outer O-ring (4) which is set in a groove located on the leftmost outer edge of the end cap (1). A hollow cavity (6) marked by a dashed line in the second component group marks the region through which the remainder of the conductive guide would be located within the connectivity. Upon assembly of the two component groups, the second component group forms a seal on the rightmost portion of the first component group causing encapsulation of the thermovolumetric substance (5) within the connectivity. Simultaneously, the assembly of the two component groups would cause a completion of the conductive guide segments housed in each component group, thereby causing a conductive state to exist within the connectivity. Upon volumetric expansion of the thermovolumetric substance (5) the two component groups would be forced apart causing separation of the segments of the conductive guide housed in each of the component groups thereby causing disconnection of the connectivity.

Referring now to FIG. 8, FIG. 8 is a cross-sectioned exploded view of the connectivity disruptor embodiment. The proportions of the assorted components in regard to one another can be observed. The order in which the components of the connectivity would need to be assembled in order to form a complete connectivity can also be seen in FIG. 8. This embodiment of the connectivity disruptor is comprised of seven compounds. These components include an end cap (1) which contains a hollow cavity (6) marked with a dashed line through the end cap (1), an inner O-ring (3) an outer O-ring (4) a hollow cylindrical column of a thermovolumetric substance (5), an outer sleeve (7) an inner column (8) which contains a hollow cavity (6) marked with a dashed line through the inner column (8), and an end barrier (9) which also contains a hollow cavity (6) marked with a dashed line through the end cap (1).

Referring now to FIG. 9, FIG. 9 is an isometric view of an assembled connectivity disruptor embodiment in which the design observed in FIG. 5-FIG. 8 is augmented with a retaining ring (12) with retaining ring clips (19) and stopper (11) to prevent reconnection of the connectivity after disconnection of the conductive guide contained within the connectivity. In this view of the connectivity, a hollow cavity (6) for the portion of the conductive guide housed inside a stopper (11) can be seen. The main body of the connectivity is comprised of an outer sleeve (7) that is permanently affixed to an end barrier (9). The retaining ring (12) screws onto a threaded collar (13) (not pictured) that is permanently affixed to the outer sleeve (7).

Referring now to FIG. 10, FIG. 10 shows the thermovolumetric substance (5) sized to that of the region that exists between the outer sleeve (7) and an inner column (8) with an overall length dictated by the distance between the end barrier (9) and a sliding ring barrier (10). This region is sealed at the lower end by the end barrier (9) and at the upper end by the sliding ring barrier (10). The sliding ring barrier (10) is sealed by an inner O-ring (3) against the inner column (8) and an outer O-ring (4) against the outer sleeve (7) such that the thermovolumetric substance (5) is fully sealed within the region that exists between the outer sleeve (7) and the inner column (8). The hollow cavity (6) marked with the dashed line inside the inner column (8) and the stopper (11) would contain conductive guide components allowing for conduction to occur within the connectivity. The hydraulic force generated by the volumetric expansion of the thermovolumetric substance (5) within the region that exists between the outer sleeve (7) and the inner column (8) would cause the sliding ring barrier (10) at the upper end of the connectivity disruptor embodiment to be forced out of the outer sleeve (7) a distance Y, thereby causing a linear actuation of the stopper (11) and subsequently disconnection of the connectivity. When disconnection of the connectivity occurs, the hollow cavity (6) would be separated into two separate hollow cavities (6). One hollow cavity (6) inside the stopper (11) containing part of the conductive guide components, the other hollow cavity (6) inside the inner column (8) containing the remainder of the conductive guide components. Separation of the conductive guide components within the two hollow cavities (6) results in a condition in which conductivity is disrupted within the connectivity. In this design, such an actuation of the sliding ring barrier (10) would result in said sliding ring barrier (10) imparting a force on the stopper (11), which is held between the retaining ring (12) and a threaded collar (13) affixed to the outer sleeve (7). The retaining ring (12) in this design is affixed onto the threaded collar (13). A detachable retaining ring (12) could be attached via any number of connecting mechanisms, such as, but not limited to: clips, screws, or pegs which fit into or clip onto the threaded collar (13) or a similar collar design that would allow for different connection mechanisms. The retaining ring (12) in this design is such that it possesses retaining ring clips (19) that prevent reconnection of the connectivity disruptor after disconnection has occurred.

Still referring to FIG. 10, the magnified region has a retaining ring (12) which is designed such that the sloped walls of the stopper (11) possess a wider diameter than the uppermost portion of the retaining ring (12). Thus, in order for the stopper (11) to pass through the retaining ring (12), the retaining ring clips (19) are forced to deflect away from their original positions. Following the passage of the stopper (11) through the retaining ring (12), the retaining ring clips (19) return to their original positions thereby regaining their initial diameter. The design of the stopper (11) is such that it is unable to pass back through the retaining ring clips (19) after passing through them. This is accomplished by the design of the stopper (11) being such that it is narrower on its upper end and wider at its lower end with a gradual slope change between the two different diameters. Because of this, the narrow end of the stopper (11) is small enough that it can pass through the retaining clips (19) at the top of the retaining ring (12). The retaining clips (19) are gradually deflected as they slide along the sloped outer surface of the stopper (11). Because the retaining ring clips (19) flex back into the position they possessed before the stopper (11) was forced through the retaining ring (12) after passage of the stopper (11), the stopper (11) is unable to return through the retaining ring (12) while in the same orientation it was in when it passed through the retaining ring (12). This is because the diameter of the lower portion of the stopper (11) is wider than the post actuation diameter of the retaining ring clips (19). Thus, the retaining ring clips (19) are not gradually forced apart by the stopper (11) and instead of causing deflection of the retaining ring clips (19) the stopper (11) impacts with the retaining ring clips (19) preventing its passage through the retaining ring (12).

FIG. 11 depicts the hollow cavity (6), located within the inner column (8), the end barrier (9) and the stopper (11) marked in the figure with a dashed line, would contain conductive guide components to allow for conduction to occur through the connectivity disruptor embodiment. In practice, when the connectivity is used, a conductive guide component is passed through the retaining ring (12) and attached to the portion of the conductive guide contained within the stopper (11). The conducting guide is then completed by inserting the stopper (11) into position on top of the sliding ring barrier (10) and thus completing the conducting guide through the connectivity by bringing the conductive guide component housed within the stopper (11) into contact with the conductive guide component inside the inner column (8). The retaining ring (12) is then secured to the threaded collar (13) which is permanently affixed to the outer sleeve (7) of the connectivity. Heating of the thermovolumetric substance (5) causes disconnection of the conducting guide by causing the conductive guide component contained within the inner column (8) to be separated from the conductive guide component contained within the stopper (11). Furthermore, the stopper (11) is forced through the retaining ring clips (19) thereby preventing future completion of the conducting guide as the stopper (11) is not able to be reinserted through the retaining ring (12). Thus, this version of the connectivity allows for not only disconnection upon volumetric expansion of the thermovolumetric substance, but it makes this disconnection permanent by preventing reconnection of the conductive guide components within the stopper (11) and the inner column (8). When volumetric expansion of the thermovolumetric substance (5) occurs, a hydraulic force is generated within the connectivity leading to disconnection of the connectivity. In order to ensure that said hydraulic force is not lessened due to leakage of the thermovolumetric substance (5) in the event the thermovolumetric substance (5) is in a liquid state, an inner O-ring (3) is used to seal the inner column (8) against the sliding ring barrier (10) and an outer O-ring (4) is used to seal the sliding ring barrier (10) against the outer sleeve (7) of the connectivity.

FIG. 12 is an isometric exploded view of the connectivity disruptor embodiment augmented with retaining ring (12) and stopper (11) to prevent reconnection of the connectivity after disconnection of the conductive guide contained within the connectivity. The proportions of the assorted components in regard to one another can be observed. The order in which the components of the connectivity would need to be assembled in order to form a complete connectivity can also be seen in this figure. This connectivity disruptor embodiment is comprised of ten components. These components include an inner O-ring (3), an outer O-ring (4), a hollow cylindrical column of a thermovolumetric substance (5), an outer sleeve (7), an inner column (8) which contains a hollow cavity (6), an end barrier (9), a sliding ring barrier (10) a stopper (11) which also contains a hollow cavity (6), a retaining ring (12) with retaining ring clips (19), and a threaded collar (13).

FIG. 13 is an isometric view of the connectivity disruptor embodiment augmented with retaining ring (12) containing retaining ring clips (19). A stopper (11) containing a hollow cavity (6) to prevent reconnection of the connectivity after disconnection of the conductive guide contained within the connectivity. In this isometric view, the connectivity has been divided into four components/component groups. The leftmost component group is comprised of the end barrier (9), the inner column (8) which contains a hollow cavity (6), the outer sleeve (7), the threaded collar (13), the inner O-ring (3) and the thermovolumetric substance (5) (not shown). To the right of the leftmost component group is the second component group comprised of the outer O-ring (4) and the sliding ring barrier (10). To the right of the second component group is the stopper (11) and to the right of the stopper (11) is the retaining ring (12). Upon assemblage of the two component groups, the second component group seals the thermovolumetric substance (5) (not shown) within the region that exists between the outer sleeve (7) and the inner column (8) of the first component group. The stopper (11) can then be brought in contact with the right side of the merged component groups thereby completing the conductive guide through the connectivity. This is depicted in FIG. 13 by the two hollow cavities (6) within the stopper (11) and the first component group that in a complete connectivity would house the components of the conductive guide. The retaining ring (12) could then be affixed to the threaded collar (13) attached to the outer sleeve (7) thereby both affixing the stopper (11) to the joined component groups and acting as a one-way mechanical stop to prevent the stopper (11) from reconnecting the connectivity after disconnection has occurred.

Referring now to FIG. 14, FIG. 14 shows an exploded isometric view of an alternative connectivity disruptor embodiment in which a thermovolumetric substance (5) is offset from a hollow cavity (6) This embodiment is comprised of five components: a threaded connection piece (14), a central cavity housing (15), a piston connection piece (16), a thermovolumetric substance (5) and an O-ring (17). In this design, the thermovolumetric substance (5) is sealed within a cavity inside the central cavity housing (15). This chamber within the central cavity housing (15) is sealed on its threaded end (not visible) by the threaded connection piece (14) that threads into the central cavity housing (15). The chamber within the central cavity housing (15) is sealed on the threaded end of the central cavity housing (15) by the piston connection piece (16) that is inserted into the central cavity housing (15). The piston connection piece (16) is sealed against the chamber holding the thermovolumetric substance (5) inside the central cavity housing (15) by the O-ring (17) that rests in a groove on the piston connection piece (16). In this alternate connectivity design, the hollow cavity (6) at the top of the piston connection piece (16) would house one segment of the conductive guide while the hollow cavity (6) at the top of the central cavity housing (15) and the top of the threaded connection piece (14) would house the remainder of the conductive guide components. In this design, installation of the conductive guide component within the central cavity housing (15) cannot be performed until the thermovolumetric substance (5) and the threaded connection piece (14) have been installed within and secured to the central cavity housing (15). In this way, removal of or tampering with the thermovolumetric substance (5) cannot be performed without causing irreparable damage to the connectivity.

FIG. 15 is an exploded, cross-sectioned view of the offset conductive guide connectivity disruptor embodiment design. The proportions of the assorted components in regard to one another can be observed. The order in which the components of the connectivity would need to be assembled in order to form a complete connectivity can also be seen in this figure. Three hollow cavities (6) for conductive guide components are visible at the tops of the threaded connection piece (14), the central cavity housing (15) and the piston connection piece (16). In the completed connectivity, the hollow cavity (6), comprised of the regions within the threaded connection piece (14) and the central cavity housing (15), would hold one segment of the conductive guide while the remaining segment of the conductive guide would be housed within the piston connection piece (16). An O-ring (17) is included in this design to allow for a seal to be created between the piston connection piece (16) and the central cavity housing (15) when the connectivity is assembled. The thermovolumetric substance (5) in this connectivity disruptor embodiment design is a cylindrical column that is inserted into the central cavity housing (15) when the concavity disruptor is assembled.

FIG. 16 shows the offset conductive guide of the connectivity disruptor embodiment as fully assembled. The continuous hollow cavity (6) at the top of the connectivity is formed. This hollow cavity (6) is marked by a dashed line and represents the region through which the conductive guide would pass through the connectivity when the connectivity is fully assembled. When fully assembled, the thermovolumetric substance (5) is sealed inside a region within the central cavity housing (15). This region is sealed on the left end by a threaded connection piece (14) that attaches directly to the central cavity housing (15) after insertion of the thermovolumetric substance (5), but before installation of the conductive guide segment within the hollow cavity (6) region created by the hollow cavities (6) of the threaded connection piece (14) and the central cavity housing (15). The region is sealed on the right end by a piston connection piece (16) which is itself sealed against the central cavity housing (15) by an O-ring (17) set into a groove on the leftmost end of the piston connection piece (16).

FIG. 17 depicts how upon heating, the thermovolumetric substance (5) undergoes volumetric expansion within the region created by the joining of the threaded connection piece (14) and the central cavity housing (15) and the piston connection piece (16) inset into the central cavity housing (15) wherein the piston connection piece (16) is sealed against the central cavity housing (15) by an O-ring (17). The volumetric expansion of the thermovolumetric substance (5) within the region generates a hydraulic force that causes the piston connection piece (16) to be forced from its location within the central cavity housing (15). This causes the hollow cavity (6) formed by the assemblage of the piston connection piece (16), the central cavity housing (15) and the threaded connection piece (14) to be separated into two distinct regions which are marked by dashed lines. These separated regions represent the separation of the conductive guide segments after actuation of the piston connection piece (16) has occurred due to the volumetric expansion of the thermovolumetric substance (5). Essentially, this figure represents the disconnected configuration of the connectivity disruptor embodiment.

FIG. 18 is a cross-sectional view of the offset conductive guide connectivity disruptor embodiment separated into two distinct component groups. The first component group located at the left side of the figure is comprised of the threaded connection piece (14), the central cavity housing (15), and the thermovolumetric substance (5). The second component group located at the right side of the figure is comprised of the piston connection piece (16) and an O-ring (17) set into a groove located on the leftmost end of the piston connection piece (16). These two component groups illustrate the state of the connectivity before connection of the connectivity has occurred. When the two component groups are joined, the second component group is inserted within the central cavity housing (15) and acts to seal the thermovolumetric substance (5) within the region formed by the threaded connection piece (14) and the central cavity housing (15). In addition, the joining of the two component groups causes the hollow cavity (6) regions marked by dashed lines at the tops of the two component groups to be joined. This joining of the hollow cavity (6) regions represents the creation of a continuous conductive guide within the connectivity since, in a complete connectivity, these regions would house conduction guide segments that would be made a continuous conductive guide through the connectivity upon joining of the two component groups.

FIG. 19 is an isometric version of an additional connectivity disruptor embodiment in which the design observed in FIG. 2 (A, B, C, & D) is augmented with a retaining ring (12) and stopper (11) to prevent reconnection of the connectivity after disconnection of the conductive guide contained within the connectivity. The stopper (11) in this design is augmented with guide fins (20) (not shown) that keep the stopper (11) centered within the retaining ring (12). The retaining ring (12) in this design is modified from that seen in FIG. 9-FIG. 13 in that the stopper (5) is retained within the retaining ring (12) by retaining ring clips (19) after the connectivity has been heated and the thermally induced disconnection of the connectivity has occurred. In this view of the connectivity, a hollow cavity (6) for the portion of the conductive guide housed inside the stopper is depicted. The main body of the connectivity is comprised of a permanent joining of a reservoir piece (2) and a ring barrier housing (18).

FIG. 20 is a cross-sectional view of a fully assembled connectivity disruptor embodiment. In this design, the cavity containing the thermovolumetric substance (5) is formed via a permanent joining of a reservoir piece (2) and a ring barrier housing (18). In this design, the sliding ring barrier (10) is contained entirely within the ring barrier housing (18) prior to any volumetric expansion of the thermovolumetric substance (5). An inner O-ring (3) that is set in a groove on the end of the reservoir piece (2) seals the sliding ring barrier (10) against the reservoir piece (2). An outer O-ring (4) that is set in a groove on the sliding ring barrier (10) seals the sliding ring barrier (10) against the ring barrier housing (18). In this design, a modified version of the retaining ring (12) seen in FIG. 5-FIG. 8 is threaded onto the ring barrier housing (18) thereby securing the stopper (11) against the sliding ring barrier (10). This version of the retaining ring (12) is designed to cause the stopper (11) to be trapped within the retaining ring (12) after volumetric expansion of the thermovolumetric substance (5) has occurred causing displacement of the sliding ring barrier (10) and subsequent linear actuation of the stopper (11) through the retaining ring clips (19) inside the retaining ring (12). The stopper (11) in this design has been augmented to have guide fins (20) that act to keep the stopper (11) centered within the retaining ring (12) during actuation of the stopper (11). During actuation, the stopper (11) is moved a distance (Y) resulting in disconnection of the conductive guide inside the hollow cavity (6) within the connectivity.

FIG. 21 is a cross-sectional view of a connectivity disruptor embodiment after volumetric expansion of the thermovolumetric substance (5) has occurred. In this state, the thermovolumetric substance (5) has expanded out of its original position in the cavity formed by the permanent joining of the reservoir piece (2) and the ring barrier housing (18) and further up into the region previously containing the sliding ring barrier (10). When actuated, a seal is maintained between the ring barrier housing (18) and the sliding ring barrier (10) by the presence of the outer O-ring (4) and between the sliding ring barrier (10) and the reservoir piece (2) via the inner O-ring (3). In this state, the volumetric expansion of the thermovolumetric substance (5) has generated a hydraulic force within the cavity formed by the permanent joining of the reservoir piece and the ring barrier housing (18), thereby causing the sliding ring barrier (10) to be moved a distance proportional to the amount of expansion undergone by the thermovolumetric substance (5). The movement of the sliding ring barrier (10) in response to the volumetric expansion of the thermovolumetric substance (5) results in actuation of the stopper (11) past the retaining ring clips (19) inside the retaining ring (12). The stopper (11) is held centered within the retaining ring (12) at this stage due to the guide fins (20) on the stopper (11). During passage of the stopper (11) past the retaining ring clips (19), the retaining ring clips (19) deform around the stopper (11) and then return to their original shape after the stopper (11) has passed through them. This effectively traps the stopper (11) within the retaining ring (12) because the return of the retaining clips (19) to their original shape prevents the stopper (11) from exiting the retaining ring (12) in the reverse of the direction from which it originally passed through the retaining ring clips (19). The movement of the stopper (11) caused by the volumetric expansion of the thermovolumetric substance (5) results in a separation of the conductive guide through the connectivity. The location at which the conductive guide segments would be located in the figure are marked by dashed lines passing through the two hollow cavities (6). The retention of the stopper (11) within the retaining ring (12) after actuation has occurred results in a permanent disconnection of the connectivity as the conductive guide segments located within the stopper (11) and within the reservoir piece (2) can never be rejoined.

FIG. 22 is a cross-sectional view of a connectivity disruptor embodiment that has been separated into two components on the top and two component groups on the bottom. The top component is the retaining ring (12) with retaining ring clips (19). The second component is the stopper (11) with guide fins (20) and a hollow cavity (6). The third section is a component group comprised of the sliding ring barrier (10) and the outer O-ring (4). The second component group in the bottom section is comprised of the reservoir piece (2), the thermovolumetric substance (5), the ring barrier housing (18) and the inner O-ring (3) with a hollow cavity (6). The purpose of this figure is to show the state of the individual components and component groups prior to assemblage of the connectivity. When assemblage of the connectivity occurs, the first component group is slid into the second component group effectively sealing the thermovolumetric substance (5) within the joined component groups. The conductive guide through the connectivity can then be completed with the joining of the conductive guide component inside the hollow cavity (6) inside the stopper (11) with the conductive guide component inside the hollow cavity (6) inside the joined component groups. The retaining ring (12) can then be used to restrain the stopper (11) via the threading of the retaining ring (12) onto the ring barrier housing (18).

FIG. 23 is an exploded cross-sectional view of a connectivity disruptor embodiment design. The proportions of the assorted components in regard to one another are depicted. This embodiment comprises a hollow cavity (6) a reservoir piece (2), an inner O-ring (3), a thermovolumetric substance (5) a ring barrier housing (18), an outer O-ring (4), a sliding ring barrier (10), a stopper (11) with guide fins (20), and a retaining ring (12) with retaining ring clips (19). The order in which the components of the connectivity would need to be assembled in order to form a complete connectivity can also be seen in this figure.

The following is a detailed description describing exemplary embodiments to illustrate the principles of the invention. The embodiments are provided to illustrate aspects of the invention, but the invention is not limited to any embodiment. The scope of the invention encompasses numerous alternatives, modifications, and equivalents; it is limited only by the claims.

Numerous specific details set forth in the figures and descriptions are shown in order to provide a thorough understanding of the invention and how to practice the invention. However, the invention may be practiced according to the claims without some or all of these specific details. For the purpose of clarity, technical material that is known in the technical fields related to the invention has not been described in detail so that the invention is not unnecessarily obscured. For example, a disruptor could be manufactured integral to either a male electrical. connector or a female electrical connector or both. For example, means to generate the disruptive force may be a mechanical device, or a kinetic substance, or a corrosive substance. Also, the thermovolumetric substance that produces hydraulic force sufficient to cause autonomous disruption of connectivity may be a compound comprising one or more ingredients including a substance such as, but not limited to, an essential oil or other means to enhance production of hydraulic energy. A dye or fluorescent substance that disperses during opening of the connector could be mixed with the thermovolumetric substance to provide a visible marker of where a disruption has occurred.

References are cited that provide detailed information about electrical systems, unsafe conditions of electrical systems, and approved techniques for implementing protection systems. However, a person with ordinary experience in instrumenting systems would understand the application also applies to technology such as but not limited to steam and chemical piping systems.

The embodiments of the invention set forth herein relate to detection, mitigation, and isolation of unsafe connectivity that incorporates the present invention for purposes of properly disconnecting the flow of electricity within in the connectivity.

In a best embodiment for use with electrical conduits, a connectivity disruptor assembly comprises an insulating body with a proximal end and a distal end and separable electrically conductive guides in a channel through the center of the body. Electrical conductors fit into the electrically conductive guides via the proximal end and distal ends of the insulating body. One or more hollow cavities within the body are filled with a dielectric thermovolumetric substance chosen for the properties of significant expansion above a selected temperature, with the purpose to produce sufficient hydraulic pressure within the chambers of the body to overcome the force of friction, static mechanisms, or adhesive bonding, securing the conductors within the electrically conductive guides, resulting in physical separation of the connectivity thereby disrupting flow of electrical current. In an alternate embodiment, the force causes movement of the electrically conductive guide, which frees the connectivity.

In another embodiment for a conduit for safely transporting a particular substance, a connectivity disruptor assembly comprises a body with a proximal end and a distal end and separable conductive guides made of a suitable non-reactive substance in a channel through the center of the body. Entrance and exit conductors fit into the conductive guides via the proximal end and distal ends of the body. One or more chambers within the body are filled with an insulating thermovolumetric substance chosen for the properties of significant expansion above a selected temperature, with the purpose to produce sufficient hydraulic pressure within the chambers of the body to overcome the force of friction, static mechanisms, or adhesive bonding, securing the conductors within the conductive guides, resulting in physical separation of the connectivity thereby disrupting flow of the particular substance within the conduit. In an alternate embodiment, the force causes movement of the conductive guide, which frees the connectivity or mitigates by rerouting the particular substance.

A technical contribution for the disclosed protection system is that it provides for unique autonomous mitigation of unsafe conditions at junctions of connectivity, such as an electrical system, and properly disconnecting the unsafe connectivity with hydraulic force before the unsafe condition that, if left unattended, could result in an unsafe event such as an arc or ground fault (in the case where conduits contain both anode and cathode), and the consequential damages thereto.

Another technical contribution for the disclosed protection system is that it provides means for containing an insulating thermovolumetric substance for quenching a plasma that results when conductors carrying elevated current at a juncture are insufficiently separated with respect to speed of separation or distance of separation. Without limitation, the quench can be accomplished by filling the void formed when the conductor separates.

One exemplary embodiment of the present invention is an apparatus that comprises at least one disruptor that releases sufficient hydraulic energy to force separation and unresettably open the circuit when a temperature internal to the connectivity rises to a desired trigger point to force open the circuit served by the connectivity to open and remain open when an excessive temperature condition is detected.

In a broad embodiment, the present invention extends to use in other equipment, which is subject to risk of damage, fire, and loss of property due to external heat such as from a fire or hot liquid, and from manufacturing defects.

In a best embodiment, a means for mitigating hazardous events is included within the connectivity. This includes but is not limited to a fire suppressant, plasma suppressant, electrical insulator, or expanding foam.

In another embodiment, a means for generating a signal indicative of disruption of connectivity in response to a hazardous event includes, but is not limited to: an acoustic device such as a buzzer; a visual indicator such as, without limitation, a lamp, a fluorescent chemical, a semaphore; or a device that produces electrical data.

In a differing embodiment, the apparatus is constructed with an insulating thermohydraulic substance selected for properties that will optimize mitigation of unsafe conditions, such as, but not limited to, an electrical arc. The substance releases sufficient hydraulic energy above a certain temperature to forcibly open the connectivity. Further, the nature of the plurality of constituents used in the embodiment is selected so that any byproducts produced are non-toxic and further, are insulating to provide arc quench.

In another embodiment, pre-detection of an emerging unsafe condition in the sensor device would send an unsafe condition signal, which results in an alarm and the associated connectivity system component being de-energized by disconnection of the flow of current with a disruptor constructed according to the teaching herein.

Another embodiment includes manual connection and disconnection of the connectivity from the system is possible without posing any risks or hazards. During installation or modification of a system which utilizes the connectivity, the connectivity may require manual disassembly. Disruption of the connectivity will be irreversible, requiring the connectivity to be removed and replaced from its installed location. Disassembly and replacement of the disrupted connectivity is safe and straightforward.

In another embodiment, the thermovolumetric substance is augmented with a sensor built into or inserted into the body. The forcible opening of the connectivity will remain the same, but a connector, which can detect when the connectivity is open, is implemented. A number of methods can be used in sensing the opening of the connectivity, including but not limited to: electronic sensors, physical sensors, optical sensors, and thermal sensors.

In a more detailed design of the alternative connectivity design in which the conductive guide is offset from the thermovolumetric substance, the threaded connection piece could be designed to include a locking mechanism or component or could, in some way, be permanently affixed to the central cavity housing such that it could not be removed after it was affixed to the central cavity housing. Additionally, the piston connection piece could include a method or mechanism to cause it to be securely affixed to the central cavity housing after initial installation until the thermovolumetric substance was thermally activated causing a subsequent actuation of the piston connection piece and thus disconnection of the connectivity.

The apparatus should be constructed to provide an amount of hydraulic force to permanently open the connectivity with the force provided by the thermovolumetric substance. A non-reversible pressure vessel is constructed of materials which can withstand and direct the energy of the thermovolumetric substance to the opening of the connectivity. A fundamental requirement of a hydraulic system is that the pressure required to achieve motion in the hydraulic system must be lower than the pressure which causes deformation or damage to the encapsulating hydraulic reservoir. Fulfilling the structural requirements of the connectivity system may utilize polymer materials or a combination of solid materials to ensure structural integrity and reliability of the connectivity under differing conditions.

The material used for producing the hydraulic energy should be encapsulated, such as, but not limited to, a suitable polymer of strength that provides accumulation of force needed to cause assured disruption of the connectivity.

According to one aspect of the present invention, the material used to produce hydraulic force along with the encapsulation material should be reliable and stable for the expected service life of the connectivity.

In accordance with a second aspect of the present invention, the apparatus could include features such as, but not limited to, a self-test function, an ability to annunciate, an ability to be interrogated by wired or wireless means, or an ability to interrupt current flow by opening the connectivity.

To test the functionality of the system, a person should create an apparatus for performing a series of measurement tests that produce data to determine the amount of hydraulic separating force generated by the thermovolumetric substance. To generate internal heating within a connectivity, ohmic heating can be utilized to simulate high temperature conditions that may occur within a connectivity in the case of a hazardous thermal event. An electrically conductive channel with a known high resistance should be used. After connecting to a source of electricity, incrementally increase current with a calibrated current source, such as a variable transformer. A thermocouple should be positioned to measure the internal temperature of the thermovolumetric substance. A pressure sensor should be attached to measure the hydraulic pressure.

Functionality of the system will further be tested using extreme yet safe conditions which will allow for the behavior of the system to be better understood during extreme conditions. As a safety device, the connectivity system must perform safely at conditions which are more hazardous than the connectivity is rated for. In the case of an electrical connectivity, heat of an exothermic chemical reaction or ohmic heating may be used to cause the initial separation of the connectivity, but arcing inside of the connectivity has the possibility to create ionized gases, which can serve as a conducting guide more easily. Efforts will be made to ensure that any arcing which occurs during the initial separation of the connectivity will not result in a hazardous situation.

In reduction to practice, we produced and experimented with several forms of prototype connectivity bodies with an internal chamber according to the teachings herein. A prototype of a thermovolumetric disruptor was constructed with 3-D printed and machined parts. Paraffin at room temperature was forced into the chamber. In practice, an injection mold to produce millions of pieces would be more efficient. The internal chamber was filled with paraffin, then capped with an air-tight lid. Paraffin was selected for the property of releasing hydraulic energy above 130 degrees Celsius. When the prototype disruptor was heated to 130 degrees Celsius in a temperature-controlled oven, the heat caused the paraffin contained within the sealed connectivity cavity to expand quickly, accumulating sufficient thermohydraulic force to separate the disruptor body.

To produce exemplary ohmic heating caused by corrosion at current typical of that of commercial connectivity at the current time, examples of corroded electrically conductive guides and pins were produced and used. The examples were assembled from simulated corroded terminals in the form of nichrome ohmic heating wires. The examples worked as described herein establishing that resistive heating within a connector well below 200 degrees Celsius that produces an arc can be means to disrupt unsafe connectivity preventing the arc from happening. Aside from internal heating, external heating tests of the connectivity were conducted in order to ensure that an external source of heat would still result in disruption of the connectivity.

Several different tests were conducted in order to evaluate the performance of different thermoexpansive materials. Initial testing of disruptor mechanisms were conducted utilizing actuators with a thermoexpansive substance inside. The simplest formation of a thermally activated disruptor was fabricated by enclosing paraffin wax inside of a metal piston onto which a force of 40 pounds was applied. Upon heating of the piston to a temperature greater than the melting point of the paraffin wax, the piston was able to move and displace the 40 pound weight a distance of 3 millimeters. Successful displacement of a large amount of mass by a relatively small piston apparatus indicated that paraffin or other thermoexpansive materials will perform adequately in the design of the thermohydraulic disruptor. A calculation using the diameter of the piston to be 3 mm shows that the pressure of the thermohydraulic substance is 59 megapascals (MPa) or 8.5 thousand pounds per square inch (ksi). This is a tremendous value of pressure and is more than suitable to cause disruption of a connectivity component by a variety of means.

Assessment of various thermoexpansive substances was performed using a procedure developed to characterize the expansion of several waxes at increasing temperatures. Commercial waxes from both Micropowders and Deurex were cast into pellets with care so as to prevent internal voids from forming. Measurements of both mass and volume were conducted on each pellet. Each cast pellet was placed in a test tube with a thermocouple, and the test tube was heated over a Bunsen burner. The temperature of the wax pellet was measured every 10 seconds during heating and during cooling. During heating and cooling of the wax pellet, a solid-liquid phase transition occurred, which was able to be seen as a plateau of the temperature curves. During a phase transition, there is latent heat required to convert a material from solid to liquid, thus the temperature of the transitioning substance is maintained at the transition temperature for a short period of time. Volumetric expansion was conducted in a similar manner. A wax pellet was placed into brake fluid inside of a test tube. Brake fluid was chosen as a liquid that could withstand high temperatures without burning or causing unexpected interactions with the wax. In order to gain an accurate measurement of volume expansion, brake fluid was used as a low volume expansion liquid to fill in any air gaps between the test tube walls and the wax pellet. As the temperature of the test tube was increased by a Bunsen burner, the height of the brake fluid was measured with respect to the temperatures. At higher temperatures, the level of brake fluid increased, indicating that the wax substance volumetrically increased with increasing temperature. Expansion curves were generated based on data recorded from the experiments. Further testing was done to ensure that the volumetric expansion of the brake fluid would not have an effect on the volume measurements of the waxes.

Moving forward from a single piston design, a ring piston design was developed in order to allow for a conduit to exist through the center of the connectivity. A prototype disruptor was developed with a hollow tube through the center, in which electronic pin connectors can be placed. The body of the prototype was machined out of aluminum and copper metal. Other components of the prototype were 3-D printed using a Stratasys Objet30 printer, which prints high resolution UV-cured plastic components. Combining machining and 3-D printing allowed for a prototype of a ring-piston style connectivity to be developed. Paraffin wax was used as the thermoexpansive substance enclosed within the ring piston prototype. Testing of the ring piston prototype showed successful expansion and success of prototype connectivity components being disrupted before an unsafe event occurred.

Various thermoexpansive substances were experimented with in order to find a substance which exhibits the highest level of expansion at a temperature within the range of 150 degrees Celsius to 200 degrees Celsius. A relationship must exist where the expansion point of the thermoexpansive material can be tuned to be well below the melting point of the housing of the material which encapsulates the thermoexpansive material. Because the temperature range at which the connectivity disruptor is supposed to be activated is known, ABS and polypropylene plastics were found to have melting points of close to 230 degrees Celsius. Because of the melting temperatures, ABS and polypropylene were utilized to fabricate the initial prototypes. Different types of casing materials can be used for the connectivity disruptor as long as their structural integrity is maintained at the disruption temperature.

The preferred embodiment of the connectivity disruptor is produced using an injection molded polymer with a softening point well above the expansion temperatures of the thermoexpansive substances. Injection molded prototypes have been produced using ABS and polypropylene plastics and a hand-operated injection molding machine. Molds for the injection molding machine were produced using the same 3-D printer which was utilized to produce initial prototypes. It was found that accurate injection molded parts can be produced using the 3-D printed molds, allowing for small scale production of interchangeable parts. Several motivations served the motion towards injection molding the prototypes. Firstly, 3-D printers capable of printing in high temperature materials are unable to print at the resolution which would be desired in a finalized design. Secondly, injection molding opens a wider variety of polymeric materials which can be chosen for use in the construction of the connectivity disruptor. Thirdly, movement towards injection molding was done in order to better understand the design of the thermohydraulic disruptor from an industrial high volume production standpoint.

The present invention has been described in terms of the preferred embodiment, and it is recognized that equivalents, alternatives, and modifications (aside from those expressly stated), are possible and within the scope of the appending claims.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. For example, in the case of electrical conduits, the connectivity may be within a junction box, a panel, or electronic assembly. As another example, in the case of chemical conduits, the connectivity may be gate valves within a distribution system. Additionally, the force of the thermovolumetric substance can be augmented by means such as, but not limited to, a spring or force generated by a thermo-kinetic substance. In another embodiment, the disruptor could be configured with a means to produce a signal indicative of the state of the continuity and/or disruption such as, but not limited to, an electronic signal, a semaphore, or release of a marker substance such as, but not limited to, a fluorescent dye. The invention should therefore not be limited by the above described embodiment, method, and examples, but by all embodiments and methods within the scope and spirit of the invention.

The previous description of specific embodiments is provided to enable any person with ordinary skill in the art to make or use the present invention. The various modifications to these embodiments will be readily apparent to those skilled in the art, and the generic principles defined herein may be applied to other embodiments without the use of the inventive faculty.

A person with ordinary skill in the art would understand that the forces generated by the thermovolumetric substance could be augmented by forces such as produced by a spring, a thermokinetic substance or other energetic component.

Definitions

Direct Current (DC): an electric current flowing in one direction only.

Alternating Current (AC): an electric current that reverses its direction many times a second at regular intervals, typically used in power supplies.

Connectivity: Connectivity as used herein is a general term that includes wiring and associated attachment means used for the purpose of conducting fluids, electrical current (AC or DC), or combinations thereof. The connectivity components are sometimes called connectors, plugs, terminals, electrodes, receptacles, and junction boxes among other names. Systems which are in connectivity are in a state of a closed circuit.

Connector: Connector as used herein is a general term for a connectivity device which bridges two ends of an electrical or fluidic system.

Conductor or Conduit: A conductor or conduit as used herein is a general term for a mechanism for transporting energy or substances over distances.

Substance or Material: The terms substance and material as used herein are interchangeable.

Thermohydraulic material: Thermohydraulic material as used herein is a general term for a substance which produces a hydraulic force as a result of heating in an enclosed chamber.

Thermovolumetric substance, thermoexpansive substance, and thermohydraulic substance: thermovolumetric substance, thermoexpansive substance, and thermohydraulic substance as used herein are interchangeable as a general term for a substance that exhibits volumetric expansion above or within a certain temperature range.

Thermokinetic substance and thermoenergetic substance: thermokinetic substance and thermoenergetic substance as used herein are interchangeable as a general term for a combination of chemically reactive substances such as explosives, pyrotechnic compositions, propellants, gun powders, and fuels that decompose with release of energy in the form of gas and heat byproducts when exposed a sufficient amount of time at or above a certain temperature.

Fire suppressant: Fire suppressant as used herein refers to substances that inhibit combustion.

Unsafe condition: An unsafe condition as used herein is a hazardous situation that precedes an unsafe event.

Hazardous condition: A hazardous condition as used herein is an unsafe situation that precedes a hazardous event.

Electric arc or arc discharge: Electric arc or arc discharge as used herein is a general term for an electrical breakdown of a gas that produces an ongoing high temperature plasma discharge, resulting from a current through normally non-conductive media such as air.

Thermal energy: Thermal energy as used herein is a general term for the internal energy present in a system by virtue of its temperature.

Thermal expansion: Thermal expansion as used herein occurs when an object expands and becomes larger due to a change in the object's temperature.

Expansive energy: Expansive energy as used herein pertains to the power related to a pressurized fluid or viscous substance used to accomplish machine motion. The pressure can be relatively static (such as reservoirs) or in motion though tubing or hoses.

Non-reactive substance: Non-reactive substance as used herein is a general term for a substance that is suitable for conducting a certain chemical.

Pro-Active: Pro-Active as used herein is a general term for being preventive; e.g., taking action based on diagnosing a pre-condition.

Photovoltaic (PV): refers to a method for generating electric power by using solar cells to convert energy from the sun into a flow of electrons. Photons of light excite electrons into a higher state of energy, allowing them to act as charge carriers for an electric current.

A person with ordinary skill in the art would understand that embodiments of the present invention can include different arrangements of cavities and channels through which the hydraulic substance flows, depending on the functionality required. Further, that while the embodiments presented in this application focus on preventing arc-faults in electrical power systems, the present invention can be applied in any situation where high temperature hazards can result in loss of life and destruction of property. Thus, the present invention is not intended to be limited to the embodiments shown herein but is to be accorded the widest scope consistent with the principles and novel features disclosed herein and as defined by the following claims.

What is claimed is:

1. An apparatus for disruption of a flow of energy by means of a hydraulic force comprising:
    a quantity of a thermovolumetric substance selected from the group of fluids consisting of brake fluids, or hydraulic fluids, or essential oils that expand volume upon heating below a certain temperature without change of physical state;
    at least one O-ring sealing means to ensure against leakage of the hydraulic force;
    an end cap configured with a first portion of a hollow cavity therethrough and configured with a piston connecting piece means having a length projecting a distance "Y";
    a reservoir piece configured with a second portion of the hollow cavity therethrough and further configured with a chamber configured for the quantity of the liquid thermovolumetric substance, wherein said chamber accepts the piston connecting piece means a depth greater than or equal to the distance "Y" for receiving the hydraulic force produced by the quantity of the thermovolumetric substance, and said chamber still further configured with means for operably accepting the at least one O-Ring sealing means to prevent leakage of the quantity of the thermovolumetric substance;
    and wherein machine motion of the piston connecting piece means, that results from the hydraulic force associated with the expanded volume of the quantity of the thermovolumetric substance acting on the piston connecting piece means, moves the piston connecting piece means a distance greater than or equal to the distance "Y" resulting in separation of the end cap from the reservoir piece thereby causing disruption of the apparatus and the flow of energy.

* * * * *